(12) United States Patent
Harada et al.

(10) Patent No.: US 10,324,317 B2
(45) Date of Patent: Jun. 18, 2019

(54) LIGHT CONTROL DEVICE, IMAGING ELEMENT, AND IMAGING DEVICE, AND LIGHT TRANSMITTANCE CONTROL METHOD FOR LIGHT CONTROL DEVICE

(71) Applicant: SONY CORPORATION, Tokyo (JP)

(72) Inventors: Kouichi Harada, Kanagawa (JP); Kyoko Izuha, Kanagawa (JP); Koji Kadono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 176 days.

(21) Appl. No.: 15/022,188

(22) PCT Filed: Aug. 28, 2014

(86) PCT No.: PCT/JP2014/072539
§ 371 (c)(1),
(2) Date: Mar. 15, 2016

(87) PCT Pub. No.: WO2015/060010
PCT Pub. Date: Apr. 30, 2015

(65) Prior Publication Data
US 2016/0231600 A1 Aug. 11, 2016

(30) Foreign Application Priority Data
Oct. 24, 2013 (JP) .................. 2013-220972

(51) Int. Cl.
*H04N 9/04* (2006.01)
*G02F 1/015* (2006.01)
*H01L 27/146* (2006.01)

(52) U.S. Cl.
CPC ........ *G02F 1/015* (2013.01); *H01L 27/14625* (2013.01); *H01L 27/14645* (2013.01);
(Continued)

(58) Field of Classification Search
CPC ............... G02F 1/015; G02F 2201/16; H01L 27/14645; H01L 27/14625; H04N 9/045; H04N 2209/045
See application file for complete search history.

(56) References Cited

U.S. PATENT DOCUMENTS 5,042,923 A * 8/1991 Wolf ................. E06B 3/6722
359/275
2005/0270411 A1* 12/2005 Kawabata ........... G02F 1/13318
348/362
(Continued)

FOREIGN PATENT DOCUMENTS

JP 2012-049485 3/2012
JP 2012-216760 11/2012
(Continued)

OTHER PUBLICATIONS

Emre O. Polat et al., "Broadband Optical Modulators Based on Graphene Supercapacitors", Department of Physics, Bilkent University, 2013, Ankara, Turkey.
(Continued)

*Primary Examiner* — Roberto Velez
*Assistant Examiner* — Tuan H Le
(74) *Attorney, Agent, or Firm* — Chip Law Group

(57) ABSTRACT

A light control device 10 includes a pair of electrodes 611 and 612 and a stacked structure body 613' of a plurality of light control layers 613 sandwiched by the pair of electrodes 611 and 612; and each light control layer 613 has a stacked structure of a first insulating layer 614, a first nanocarbon film 615 doped with an n-type impurity or not doped with an impurity, a second insulating layer 617, and a second nanocarbon film 616 doped with a p-type impurity or not doped with an impurity.

11 Claims, 12 Drawing Sheets

(52) U.S. Cl.
CPC ......... *H04N 9/045* (2013.01); *G02F 2201/16* (2013.01); *H04N 2209/045* (2013.01)

(56) References Cited

U.S. PATENT DOCUMENTS

| | | | |
|---|---|---|---|
| 2009/0161200 A1* | 6/2009 | Jang | G02F 1/167 359/296 |
| 2009/0230847 A1* | 9/2009 | Iwaki | H01L 51/5048 313/504 |
| 2010/0085713 A1* | 4/2010 | Balandin | H01L 23/373 361/705 |
| 2011/0216212 A1* | 9/2011 | Watanabe | H04N 5/2353 348/222.1 |
| 2012/0085526 A1* | 4/2012 | Yeh | F28F 7/00 165/185 |
| 2012/0249829 A1* | 10/2012 | Izuha | H01L 27/14621 348/229.1 |
| 2013/0334402 A1* | 12/2013 | Izuha | H01L 27/146 250/208.1 |
| 2015/0096610 A1* | 4/2015 | Okubo | C07D 519/00 136/256 |
| 2015/0380579 A1* | 12/2015 | Kim | H01L 51/444 257/431 |

FOREIGN PATENT DOCUMENTS

| | | |
|---|---|---|
| JP | 2013-257482 | 12/2013 |
| JP | 2014-017468 | 1/2014 |
| WO | 2012-166572 | 12/2012 |

OTHER PUBLICATIONS

Chi-Fan Chen et al., "Controlling inelastic light scattering quantum pathways in graphene", Nature, Mar. 31, 2011, vol. 471, pp. 617-620, Macmillen Publishers Limited.

* cited by examiner

| $G_1$ | $B_1$ | $G_0$ | $B_0$ | $G_1$ | $B_1$ | $G_0$ | $B_0$ |
|---|---|---|---|---|---|---|---|
| $R_0$ | $G_0$ | $R_1$ | $G_1$ | $R_0$ | $G_0$ | $R_1$ | $G_1$ |
| $G_0$ | $B_0$ | $G_1$ | $B_1$ | $G_0$ | $B_0$ | $G_1$ | $B_1$ |
| $R_1$ | $G_1$ | $R_0$ | $G_0$ | $R_1$ | $G_1$ | $R_0$ | $G_0$ |
| $G_1$ | $B_1$ | $G_0$ | $B_0$ | $G_1$ | $B_1$ | $G_0$ | $B_0$ |
| $R_0$ | $G_0$ | $R_1$ | $G_1$ | $R_0$ | $G_0$ | $R_1$ | $G_1$ |
| $G_0$ | $B_0$ | $G_1$ | $B_1$ | $G_0$ | $B_0$ | $G_1$ | $B_1$ |
| $R_1$ | $G_1$ | $R_0$ | $G_0$ | $R_1$ | $G_1$ | $R_0$ | $G_0$ |

FIG.8B

| $B_0$ | $IR_1$ | $B_0$ | $IR_1$ |
|---|---|---|---|
| $G_0$ | $R_0$ | $G_0$ | $R_0$ |
| $B_0$ | $IR_1$ | $B_0$ | $IR_1$ |
| $G_0$ | $R_0$ | $G_0$ | $R_0$ |

EXAMPLES OF SPECTRAL TRANSMITTANCE CHARACTERISTICS OF
ELECTROCHROMIC FILM

LIGHT CONTROL DEVICE, IMAGING ELEMENT, AND IMAGING DEVICE, AND LIGHT TRANSMITTANCE CONTROL METHOD FOR LIGHT CONTROL DEVICE

TECHNICAL FIELD

The present disclosure relates to a light control device, an imaging element, and an imaging device, and a light transmittance control method for a light control device.

BACKGROUND ART

There is known a technology in which, in an imaging element, the dynamic range is expanded by controlling the quantity of incident light. For example, in JP 2012-049485A, a solid state imaging device including a semiconductor substrate having a light receiving surface on which photoelectric conversion units are formed to be partitioned in pixels arranged in a matrix configuration, an electrochromic film that is formed on the semiconductor substrate on the light incidence path for the photoelectric conversion unit in partial pixels selected from the pixels and of which the light transmittance changes from a first transmittance to a second transmittance in accordance with the applied voltage, a lower electrode formed on the lower side of the electrochromic film, and an upper electrode formed on the upper side of the electrochromic film is disclosed. Here, the upper electrode and the lower electrode are made of a nanocarbon material containing graphene or carbon nanotubes, or indium tin oxide.

CITATION LIST

Patent Literature

Patent Literature 1: JP 2012-049485A

SUMMARY OF INVENTION

Technical Problem

As shown in the schematic diagram in FIG. 13, the light transmittance of an electrochromic film has a wavelength dependence. Therefore, there is a problem that the rate of expansion of the dynamic range changes depending on the wavelength of the light incident on the electrochromic film. Furthermore, it is difficult to shorten the time required for the change in light transmittance.

Thus, an object of the present disclosure is to provide a light control device (light control element) in which there is no wavelength dependence of light transmittance and the time required for the change in light transmittance is short, an imaging element and an imaging device including the light control device (light control element), and a light transmittance control method for the light control device (light control element).

Solution to Problem

In order to achieve the above object, according to a first aspect of the present disclosure, there is provided a light control device (light control element) including: a pair of electrodes; and a light control layer sandwiched by the pair of electrodes. The light control layer has a stacked structure of a first insulating layer, a first nanocarbon film doped with an impurity of a first conductivity type or not doped with an impurity, a second nanocarbon film doped with an impurity of a second conductivity type different from the first conductivity type or not doped with an impurity, and a second insulating layer.

In order to achieve the above object, according to a second aspect of the present disclosure, there is provided a light control device (light control element) including: a pair of electrodes; and a light control layer sandwiched by the pair of electrodes. The light control layer has a stacked structure of a first insulating layer, a nanocarbon film doped with an impurity or not doped with an impurity, and a second insulating layer. A voltage different from a voltage applied to the pair of electrodes is applied to the nanocarbon film.

In order to achieve the above object, according to a third aspect of the present disclosure, there is provided a light control device (light control element) including: a pair of electrodes: and a stacked structure body in which M (provided that M≥2) light control layers sandwiched by the pair of electrodes are stacked. An m-th light control layer (provided that 1≤m≤(M−1)) has a stacked structure of a first insulating layer, a first nanocarbon film doped with an n-type impurity or not doped with an impurity, a second insulating layer, and a second nanocarbon film doped with a p-type impurity or not doped with an impurity. An M-th light control layer has a stacked structure of the first insulating layer, the first nanocarbon film doped with an n-type impurity or not doped with an impurity, the second insulating layer, the second nanocarbon film doped with a p-type impurity or not doped with an impurity, and a third insulating layer. A voltage different from a voltage applied to the first nanocarbon film is applied to the second nanocarbon film.

In order to achieve the above object, according to the first aspect of the present disclosure, there is provided an imaging element including: a light receiving element (photoelectric conversion element); and a light control device (light control element) disposed on a light incidence side of the light receiving element. The light control device includes a pair of electrodes, and a light control layer sandwiched by the pair of electrodes. The light control layer has a stacked structure of a first insulating layer, a first nanocarbon film doped with an impurity of a first conductivity type or not doped with an impurity, a second nanocarbon film doped with an impurity of a second conductivity type different from the first conductivity type or not doped with an impurity, and a second insulating layer.

In order to achieve the above object, according to the second aspect of the present disclosure, there is provided an imaging element including: a light receiving element (photoelectric conversion element); and a light control device (light control element) disposed on a light incidence side of the light receiving element. The light control device includes a pair of electrodes, and a light control layer sandwiched by the pair of electrodes. The light control layer has a stacked structure of a first insulating layer, a nanocarbon film doped with an impurity or not doped with an impurity, and a second insulating layer. A voltage different from a voltage applied to the pair of electrodes is applied to the nanocarbon film.

In order to achieve the above object, according to the third aspect of the present disclosure, there is provided an imaging element including: a light receiving element (photoelectric conversion element); and a light control device (light control element) disposed on a light incidence side of the light receiving element. The light control device includes a pair of electrodes, and a stacked structure body in which M (provided that M≥2) light control layers sandwiched by the pair of electrodes are stacked. An m-th light control layer (provided that 1≤m≤(M−1)) has a stacked structure of a first insulating layer, a first nanocarbon film doped with an n-type impurity or not doped with an impurity, a second insulating layer, and a second nanocarbon film doped with a p-type impurity or not doped with an impurity. An M-th light control layer has a stacked structure of the first insulating layer, the first nanocarbon film doped with an n-type impurity or not doped with an impurity the second insulating layer, the second nanocarbon film doped with a p-type impurity or not doped with an impurity, and a third insulating layer. A voltage different from a voltage applied to the first nanocarbon film is applied to the second nanocarbon film.

In order to achieve the above object, according to the first aspect of the present disclosure, there is provided an imaging device (solid state imaging device) including imaging elements arranged in a two-dimensional matrix configuration. At least part of the imaging elements arranged in a two-dimensional matrix configuration include a light receiving element (photoelectric conversion element) and a light control device (light control element) disposed on a light incidence side of the light receiving element. The light control device includes a pair of electrodes, and a light control layer sandwiched by the pair of electrodes. The light control layer has a stacked structure of a first insulating layer a first nanocarbon film doped with an impurity of a first conductivity type or not doped with an impurity, a second nanocarbon film doped with an impurity of a second conductivity type different from the first conductivity type or not doped with an impurity, and a second insulating layer.

In order to achieve the above object, according to the second aspect of the present disclosure, there is provided an imaging device (solid state imaging device) including imaging elements arranged in a two-dimensional matrix configuration. At least part of the imaging elements arranged in a two-dimensional matrix configuration include a light receiving element (photoelectric conversion element) and a light control device (light control element) disposed on a light incidence side of the light receiving element. The light control device includes a pair of electrodes, and a light control layer sandwiched by the pair of electrodes. The light control layer has a stacked structure of a first insulating layer, a nanocarbon film doped with an impurity or not doped with an impurity, and a second insulating layer. A voltage different from a voltage applied to the pair of electrodes is applied to the nanocarbon film.

In order to achieve the above object, according to the third aspect of the present disclosure, there is provided an imaging device (solid state imaging device) including imaging elements arranged in a two-dimensional matrix configuration. At least part of the imaging elements arranged in a two-dimensional matrix configuration include a light receiving element (photoelectric conversion element) and a light control device (light control element) disposed on a light incidence side of the light receiving element. The light control device includes a pair of electrodes, and a stacked structure body in which M (provided that M≥2) light control layers sandwiched by the pair of electrodes are stacked. An m-th light control layer (provided that 1≤m≤(M−1)) has a stacked structure of a first insulating layer, a first nanocarbon film doped with an n-type impurity or not doped with an impurity, a second insulating layer, and a second nanocarbon film doped with a p-type impurity or not doped with an impurity. An M-th light control layer has a stacked structure of the first insulating layer, the first nanocarbon film doped with an n-type impurity or not doped with an impurity, the second insulating layer, the second nanocarbon film doped with a p-type impurity or not doped with an impurity, and a third insulating layer. A voltage different from a voltage applied to the first nanocarbon film is applied to the second nanocarbon film.

In order to achieve the above object, according to the first aspect of the present disclosure, there is provided a light transmittance control method for a light control device, the light control device (light control element) including a pair of electrodes, and a light control layer sandwiched by the pair of electrodes. The light control layer has a stacked structure of a first insulating layer, a first nanocarbon film doped with an impurity of a first conductivity type or not doped with an impurity, a second nanocarbon film doped with an impurity of a second conductivity type different from the first conductivity type or not doped with an impurity, and a second insulating layer. Light of a wavelength not less than a wavelength $\lambda_0$ is allowed to pass at a higher light transmittance than light of a wavelength less than the wavelength $\lambda_0$ by applying a prescribed voltage $V_0$ between the pair of electrodes. The light transmittance control method includes controlling an effective light transmittance of the light control layer for light of a wavelength not less than the wavelength $\lambda_0$ by changing a duty ratio of the pulsed prescribed voltage $V_0$.

In order to achieve the above object, according to the second aspect of the present disclosure, there is provided a light transmittance control method for a light control device, the light control device (light control element) including a pair of electrodes, and a light control layer sandwiched by the pair of electrodes. The light control layer has a stacked structure of a first insulating layer, a nanocarbon film doped with an impurity or not doped with an impurity, and a second insulating layer. Light of a wavelength not less than a wavelength $\lambda_0$ is allowed to pass at a higher light transmittance than light of a wavelength less than the wavelength $\lambda_0$ by applying a prescribed voltage $V_0$ different from a voltage applied to the pair of electrodes to the nanocarbon film. The light transmittance control method includes controlling an effective light transmittance of the light control layer for light of a wavelength not less than the wavelength $\lambda_0$ by changing a duty ratio of the pulsed prescribed voltage $V_0$.

In order to achieve the above object, according to the third aspect of the present disclosure, there is provided a light transmittance control method for a light control device, the light control device (light control element) including a pair of electrodes, and a stacked structure body in which M (provided that M≥2) light control layers sandwiched by the pair of electrodes are stacked. An m-th light control layer (provided that 1≤m≤(M−1)) has a stacked structure of a first insulating layer, a first nanocarbon film doped with an n-type impurity or not doped with an impurity, a second insulating layer, and a second nanocarbon film doped with a p-type impurity or not doped with an impurity. An M-th light control layer has a stacked structure of the first insulating layer, the first nanocarbon film doped with an n-type impurity or not doped with an impurity, the second insulating layer, the second nanocarbon film doped with a p-type impurity or not doped with an impurity, and a third insulating layer. Light of a wavelength not less than a wavelength $\lambda_0$ is allowed to pass at a higher light transmittance than light of a wavelength less than the wavelength $\lambda_0$ by applying a prescribed voltage $V_0$ (provided that a voltage applied to the second nanocarbon film is different from a voltage applied to the first nanocarbon film) between the second nanocarbon film and the first nanocarbon film. The light transmittance control method includes controlling an effective light transmittance of the light control layer for light of a wavelength not less than the wavelength $\lambda_0$ by changing a duty ratio of the pulsed prescribed voltage $V_0$.

Advantageous Effects of Invention

In the light control device (light control element), the imaging element, and the imaging device according to the first aspect of the present disclosure, since the light control layer has a stacked structure of the first insulating layer, the first nanocarbon film doped with an impurity of the first conductivity type or not doped with an impurity, the second nanocarbon film doped with an impurity of the second conductivity type or not doped with an impurity, and the second insulating layer, when a voltage is applied to the pair of electrodes, a positive or negative charge is induced in either one of the first nanocarbon film and the second nanocarbon film and a negative or positive charge is induced in the other in accordance with the polarity of the applied voltage. Consequently, the wavelength band of light that can pass through the light control layer at a high light transmittance is determined. That is, the light transmittance of the light control layer can be controlled. Here, when the first nanocarbon film is doped with an impurity of the first conductivity type and the second nanocarbon film is doped with an impurity of the second conductivity type, a p-n junction is formed at the interface between the first nanocarbon film and the second nanocarbon film; and when a reverse bias voltage is applied to the pair of electrodes, a charge is retained in each of the first nanocarbon film and the second nanocarbon film. Alternatively, even in the case where the first nanocarbon film and/or the second nanocarbon film is not doped with an impurity, when an appropriate voltage is applied to the pair of electrodes, a charge is retained in each of the first nanocarbon film and the second nanocarbon film. In the light control device (light control element), the imaging element, and the imaging device according to the second aspect of the present disclosure, the light control layer has a stacked structure of the first insulating layer, the nanocarbon film doped with an impurity or not doped with an impurity, and the second insulating layer, and a voltage different from the voltage applied to the pair of electrodes is applied to the nanocarbon film; thus, the light transmittance of the light control layer can be controlled. In the light control device (light control element), the imaging element, and the imaging device according to the third aspect of the present disclosure, a stacked structure body in which M (provided that M≥2) light control layers having a prescribed configuration are stacked is provided, and a voltage different from the voltage applied to the first nanocarbon film is applied to the second nanocarbon film; thus, the light transmittance of the light control layer can be controlled. In the light control device etc. according to the first aspect to the third aspect of the present disclosure, since a current does not flow between the pair of electrodes, low power consumption can be achieved. In the light transmittance control method for a light control device (light control element) according to the first aspect to the third aspect of the present disclosure, the effective light transmittance of the light control layer for light of wavelengths not less than the wavelength $\lambda_0$ is controlled by changing the duty ratio of the pulsed prescribed voltage $V_0$; thus, the value of the wavelength $\lambda_0$ may be set to, for example, blue color (e.g. 380 nm) and setting may be made so that the light transmittance for light of wavelengths not less than the wavelength $\lambda_0$ (for example, light having a wavelength band of visible light or more) when the prescribed voltage $V_0$ is applied is almost 100%, and thereby a desired value of light transmittance can be obtained accurately and easily and setting to a desired value of light transmittance can be made. In addition, in the nanocarbon film, there is no wavelength dependence of light transmittance, and the time required for the change in light transmittance is short. The effects described in this specification are only examples and are not limitative ones, and there may be additional effects.

BRIEF DESCRIPTION OF DRAWINGS

FIG. 6A and FIG. 6B are diagrams schematically showing layouts of imaging element groups.

FIG. 7A and FIG. 7B are diagrams schematically showing layouts of imaging element groups.

FIG. 8A and FIG. 8B are diagrams schematically showing layouts of imaging element groups.

DESCRIPTION OF EMBODIMENTS

Figure 1A:
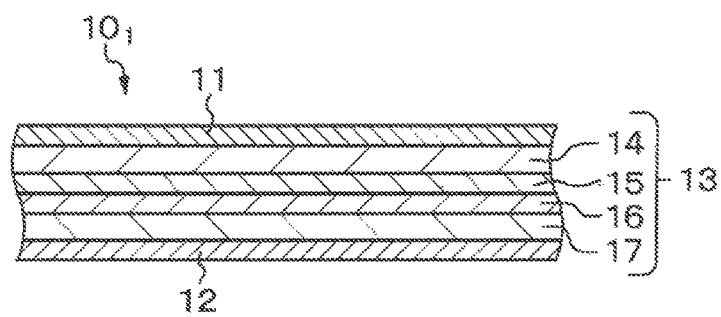
FIG. 1A is a schematic partial end view of a light control device of Embodiment 1.

Hereinbelow, the present disclosure is described based on Embodiments with reference to the drawings, but the present disclosure is not limited to Embodiments and the various numerical values and materials in Embodiments are only examples. The description is given in the following order.

1. Overall description of the light control device, the imaging element, and the imaging device of the present disclosure and the light transmittance control method for a light control device of the present disclosure
2. Embodiment 1 (a light control device according to the first aspect of the present disclosure and a light transmittance control method for a light control device according to the first aspect of the present disclosure)
3. Embodiment 2 (a modification of Embodiment 1)
4. Embodiment 3 (an imaging element according to the first aspect of the present disclosure and an imaging device according to the first aspect of the present disclosure)
5. Embodiment 4 (a modification of Embodiment 3)
6. Embodiment 5 (a light control device, a light transmittance control method for a light control device, an imaging element, and an imaging device according to the second aspect of the present disclosure)
7. Embodiment 6 (a light control device, a light transmittance control method for a light control device, an imaging element, and an imaging device according to the third aspect of the present disclosure), etc.

[Overall Description of the Light Control Device, the Imaging Element, and the Imaging Device of the Present Disclosure and the Light Transmittance Control Method for a Light Control Device of the Present Disclosure]

In the following description, the light control device according to the first aspect of the present disclosure, the light control device provided in the imaging element according to the first aspect of the present disclosure, the light control device provided in the imaging device according to the first aspect of the present disclosure, and the light control device in the light transmittance control method for a light control device according to the first aspect of the present disclosure are collectively referred to as "a light control device etc. according to the first aspect of the present disclosure." Furthermore, in the following description, the light control device according to the second aspect of the present disclosure, the light control device provided in the imaging element according to the second aspect of the present disclosure, the light control device provided in the imaging device according to the second aspect of the present disclosure, and the light control device in the light transmittance control method for a light control device according to the second aspect of the present disclosure are collectively referred to as "a light control device etc. according to the second aspect of the present disclosure." Furthermore, in the following description, the light control device according to the third aspect of the present disclosure, the light control device provided in the imaging element according to the third aspect of the present disclosure, the light control device provided in the imaging device according to the third aspect of the present disclosure, and the light control device in the light transmittance control method for a light control device according to the third aspect of the present disclosure are collectively referred to as "a light control device etc. according to the third aspect of the present disclosure."

In the imaging device according to the first aspect to the third aspect of the present disclosure, a configuration in which the pair of electrodes are shared between imaging elements including the light control device is possible, or a configuration in which the pair of electrodes shared between imaging elements including the light control device are provided to be also shared with an imaging element not including the light control device is possible.

In the light control device etc. according to the first aspect of the present disclosure including the preferred configurations mentioned above, a configuration in which a voltage is applied to the pair of electrodes to control the amount of charge generated in the first nanocarbon film and/or the second nanocarbon film and thereby the light transmittance in the light control layer is controlled is possible.

In the light control device etc. according to the first aspect of the present disclosure including the various preferred configurations described above, a configuration in which
N light control layers and (N+1) electrodes are provided,
the N light control layers and the (N+1) electrodes are alternately stacked, and
the electrodes in odd positions are connected to a first interconnection and the electrodes in even positions are connected to a second interconnection is possible.

In the light control device etc. according to the first aspect of the present disclosure including the various preferred configurations described above, a configuration in which
the first conductivity type is the n-type and the second conductivity type is the p-type, and
a voltage higher than the voltage applied to a second electrode facing the second nanocarbon film via the second insulating layer is applied to a first electrode facing the first nanocarbon film via the first insulating layer is possible. That is, by employing such a configuration, a negative charge is induced in the first nanocarbon film and a positive charge is induced in the second nanocarbon film. Here, when the first nanocarbon film is doped with an n-type impurity and the second nanocarbon film is doped with a p-type impurity, a p-n junction is formed at the interface between the first nanocarbon film and the second nanocarbon film, and a charge is retained in each of the first nanocarbon film and the second nanocarbon film while a reverse bias voltage is applied to the pair of electrodes. As a result of the above, the wavelength band of light that can pass through the light control layer at a high light transmittance is determined.

In the light control device etc. according to the first aspect of the present disclosure including the various preferred configurations described above, a configuration in which the voltage applied to the pair of electrodes is a pulsed voltage is possible. In this case, a configuration in which the light transmittance in the light control layer is controlled by changing the duty ratio of the pulsed voltage is possible. In these cases, a configuration in which the value obtained by converting the change in light transmittance of the nanocarbon film in the light control layer to frequency is higher than the frequency of the pulsed voltage is possible. The frequency of the pulsed voltage is preferably not less than $1 \times 10^2$ Hz and not more than $1 \times 10^5$ Hz.

In the light control device etc. according to the second aspect of the present disclosure including the preferred configurations mentioned above, a configuration in which the impurity is of the p-type and a voltage higher than the voltage applied to the pair of electrodes is applied to the nanocarbon film is possible. Alternatively, a configuration in which the impurity is of the n-type and a voltage lower than the voltage applied to the pair of electrodes is applied to the nanocarbon film is possible.

In the light control device etc. according to the second aspect of the present disclosure including the various preferred configurations described above, a configuration in which the voltage applied to the nanocarbon film is a pulsed voltage is possible. In this case, a configuration in which the light transmittance in the light control layer is controlled by changing the duty ratio of the pulsed voltage is possible. In these cases, a configuration in which the value obtained by converting the change in light transmittance of the nanocarbon film in the light control layer to frequency is higher than the frequency of the pulsed voltage is possible. The frequency of the pulsed voltage is preferably not less than $1\times10^2$ Hz and not more than $1\times10^3$ Hz.

In the light control device etc. according to the third aspect of the present disclosure including the preferred configurations mentioned above, a configuration in which a voltage not more than the voltage applied to the second nanocarbon film and not less than the voltage applied to the first nanocarbon film is applied to the pair of electrodes (or the application of the voltage is performed) is possible. In the light control device etc. according to the third aspect of the present disclosure including such a configuration, a configuration in which the first nanocarbon film is connected to a first interconnection and the second nanocarbon film is connected to a second interconnection is possible.

In the light control device etc. according to the third aspect of the present disclosure including the various preferred configurations described above, a configuration in which the voltage applied to the second nanocarbon film and the first nanocarbon film is a pulsed voltage is possible. In this case, a configuration m which the light transmittance in the light control layer is controlled by changing the duty ratio of the pulsed voltage is possible. In these cases, a configuration in which the value obtained by converting the change in light transmittance of the nanocarbon film in the light control layer to frequency is higher than the frequency of the pulsed voltage is possible. The frequency of the pulsed voltage is preferably not less than $1\times10^2$ Hz and not more than $1\times10^5$ Hz.

In the light transmittance control method for a light control device according to the first aspect to the third aspect of the present disclosure (hereinafter, occasionally abbreviated as simply "a light transmittance control method of the present disclosure"), it is preferable that the value obtained by converting the change in light transmittance of the nanocarbon film in the light control layer to frequency be higher than the frequency of the pulsed voltage. In this case, the frequency of the pulsed voltage is preferably not less than $1\times10^2$ Hz and not more than $1\times10^5$ Hz.

In the light control device etc. according to the first aspect to the third aspect of the present disclosure including the various preferred configurations described above, a configuration in which the nanocarbon film is formed of graphene is possible, but not limited to this, also a configuration of being formed of carbon nanotubes is possible. Since the thickness of graphene is the thickness of one layer of atoms, the thickness of the light control device can be reduced and reduction in the height (thickness) of the imaging element or the imaging device can be achieved by forming the nanocarbon film out of graphene.

The pair of electrodes in the light control device etc. according to the first aspect to the third aspect of the present disclosure may be formed of a nanocarbon film, or may be formed of a transparent conductive material layer; or one of the pair of electrodes may be formed of a nanocarbon film and the other may be formed of a transparent conductive material layer. As the material that forms the transparent conductive material layer, ITO (an indium-tin composite oxide, including Sn-doped $In_2O_3$, crystalline ITO, and amorphous ITO), IZO (an indium-zinc composite oxide), AZO (zinc oxide doped with aluminum oxide), GZO (gallium-doped zinc oxide), AlMgZnO (zinc oxide doped with aluminum oxide and magnesium oxide), an indium-gallium composite oxide (IGO), In—$GaZnO_4$ (TGZO), IFO (F-doped $In_2O_3$), antimony-doped $SnO_2$ (ATO), FTO (F-doped $SnO_2$), tin oxide ($SnO_2$), zinc oxide (ZnO), B-doped ZnO, InSnZnO, or ITiO (Ti-doped $In_2O_3$) may be illustrated.

The first insulating layer, the second insulating layer, and the third insulating layer need to be formed of a material that is transparent to the light incident on the light control device etc. according to the first aspect to the third aspect of the present disclosure. As the insulating material that forms the first insulating layer, the second insulating layer, and the third insulating layer, known insulating materials, such as $SiO_2$-based materials such as $SiO_2$, NSG (non-doped silicate glass), BPSG (boron phosphorus silicate glass), PSG, BSG, AsSG, PbSG, SbSG, SOG (spin-on glass), SiOC, and SiOF; SiN-based materials including SiON and SiCN; metal oxides such as aluminum oxide ($Al_2O_3$), titanium oxide ($TiO_2$), ZnO, indium oxide ($In_2O_3$), tin oxide ($SnO_2$), gallium oxide ($Ga_2O_3$), tellurium oxide ($TeO_2$), germanium oxide ($GeO_2$), cadmium oxide (CdO), tungsten oxide ($WO_3$), and molybdenum oxide ($MoO_3$); metal nitrides; and metal oxynitrides, may be given; and these may be used singly or in combination as appropriate. As the method for forming the first insulating layer, the second insulating layer, and the third insulating layer, known methods such as various CVD methods, the application method, various PVD methods including the sputtering method and the vacuum deposition method, various printing methods such as the screen printing method, and the sol-gel method may be given.

Alternatively, in the light control device etc. according to the first aspect of the present disclosure, as the first insulating layer and the second insulating layer, a material with a high density of polarization charge which, when a voltage is applied to the pair of electrodes, can induce a charge in the first nanocarbon film and the second nanocarbon film without causing insulation breakdown is preferably used. In order to increase the amount of charge stored in the nanocarbon film by voltage application, it is preferable to use a dielectric material with a large relative permittivity (a paraelectric material or a high dielectric material), for example a dielectric material with a relative permittivity of 2.0 or more, preferably with a relative permittivity of 4.0 or more, and more preferably with a relative permittivity of 8.0 or more, as the dielectric material that forms the first insulating layer and the second insulating layer. Also a ferroelectric material having spontaneous polarization may be used as the dielectric material that forms the first insulating layer and the second insulating layer. Alternatively, organic substances such as polyvinylidene fluoride (PVDF) (relative permittivity: approximately 10), high density polyethylene (HDPE), and amorphous fluorine resins, ionic liquids, liquid crystals, etc. may be given. In general, inorganic oxides have high dielectricity and insulating properties, and on the other hand have low transmissivity in the far-infrared region. In the case of performing light transmittance control in the far-infrared region, $CaF_2$ or the like, which has high transmissivity in the far-infrared region, is preferably used as the dielectric material that forms the first insulating layer and the second insulating layer, for example. The relative permittivity etc. of various dielectric materials are shown in Table 1 below. The above description can be applied also to the light control device etc. according to the second aspect and the third aspect of the present disclosure.

TABLE 1

| Dielectric material | Relative permittivity | Insulation breakdown voltage (MV/cm) | Charge density ($\mu$C/cm$^2$) |
|---|---|---|---|
| SiO$_2$ | 4 | 10 | 3.5 |
| Al$_2$O$_3$ | 8.2 | 8.2 | 6.0 |
| h-BN | 4 | 20 | 7.1 |
| HfO$_2$ | 18.5 | 7.4 | 12.0 |
| ZrO$_2$ | 29 | 6 | 15.4 |
| ZnO | 7.9 | | |
| TiO$_2$ | 8.5 | | |
| IGZO | 10 | | |
| SiN | 7 | 40 | 2.5 |
| GaN | 9.5 | | |
| STO | 140-200 | 2 | 24.8-35.4 |
| BTO | 200 | 0.4 | 7.1 |
| PZT | 700 | 0.5 | 30.9 |
| PTO | 100-200 | 0.675 | 6.1-11.9 |
| PLZT | 900 | 1.4 | 111 |
| CaF$_2$ | 6.6 | 0.3 | 1.1 |

Here, "h-BN" denotes hexagonal boron nitride, "STO" strontium titanate (SrTiO$_3$), "BTO" barium titanate, "PZT" lead zirconate titanate, "PTO" lead titanate, and "PLZT" lead lanthanum zirconate titanate ((Pb,La)(Zr,Tr)O$_3$).

As the light receiving element in the imaging element or the imaging device according to the first aspect to the third aspect of the present disclosure, specifically a photosensor (photodiode) may be given; and a CMOS image sensor or a CCD image sensor is formed by using the light receiving element. Alternatively, a bolometer-type light receiving element may be formed. The imaging element or the imaging device itself may be an imaging element or an imaging device of a known configuration and a known structure.

Since the light transmittance per nanocarbon film is 97.7% (light absorptance being 2.3%), a light control device including a plurality of light control layers may be used in order to reduce the light transmittance greatly. For example, in a light control device in which 30 light control layers (60 nanocarbon films in total) are stacked, the light transmittance can be reduced up to $0.977^{60}$=approximately 25% as a whole.

Chemical doping may be performed in order to dope the nanocarbon film with an impurity of the first conductivity type or the second conductivity type, for example. To perform chemical doping, specifically, a dopant layer may be formed on the nanocarbon film. The dopant layer may be an electron-accepting (p-type) dopant layer, or may be an electron-donating (n-type) dopant layer. As the material that forms the electron-accepting (p-type) dopant layer, chlorides such as AuCl$_3$, HAuCl$_4$, and PtCl$_4$; acids such as HNO$_3$, H$_2$SO$_4$, HCl, and nitromethane; group III elements such as boron and aluminum; and electron-withdrawing molecules such as oxygen may be given; and as the material that forms the electron-donating (n-type) dopant layer, in addition to group V elements such as nitrogen and phosphorus, pyridine-based compounds, nitrides, alkali metals, and electron-donating molecules such as aromatic compounds having an alkyl group may be given.

As necessary, the thickness of the insulating layer may be adjusted so that the light of a wavelength to be controlled in light transmittance is multiply reflected in the light control layer. Thereby, the light transmittance during transparency of the light control layer can be brought close to 100%.

As necessary, metal nanoparticles or metal nanowires may be formed on or above the nanocarbon film to utilize the surface plasmon polariton phenomenon of them; thereby, the light transmittance per nanocarbon film can be made lower than 97.7%, for example.

The nanocarbon film may be formed of graphene as described above; graphene refers to a sheet-like substance of sp$^2$-bonded carbon atoms with the thickness of one atom, and has a hexagonal lattice structure like a honeycomb composed of carbon atoms and the bonds between them. As advantages of using graphene of such characteristics for electronic devices such as imaging elements, imaging devices, light control devices, and shutter devices, the following can be given; the light transmittance during transparency per light control layer is as high as almost 100%; the sheet resistance value per light control layer is as low as 1 k$\Omega$/□; and the film thickness is as small as 0.3 nm.

Figure 11A:
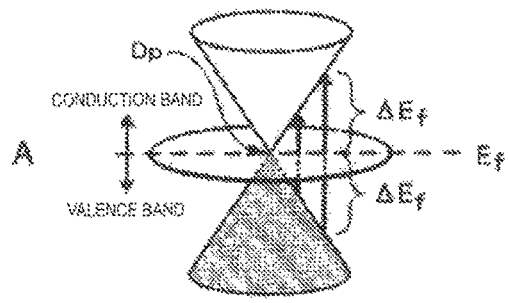
FIG. 11A, FIG. 11B, FIG. 11C, and FIG. 11D are diagrams schematically showing variations of the forbidden band based on variations of the Fermi level $E_f$ in the band structure of graphene.
Figure 11B:
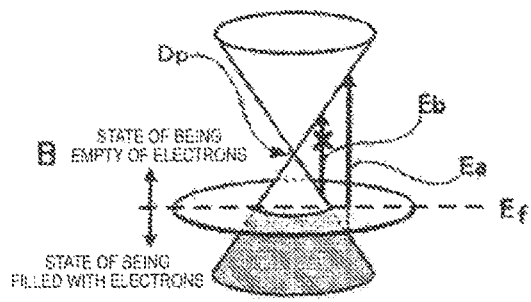
Figure 11C:
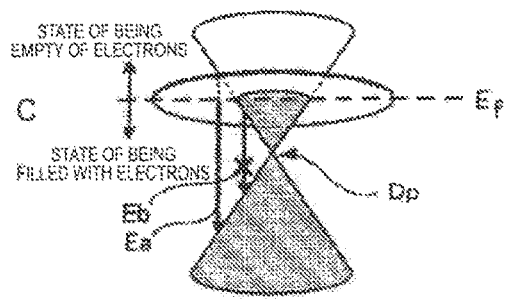
Figure 11D:
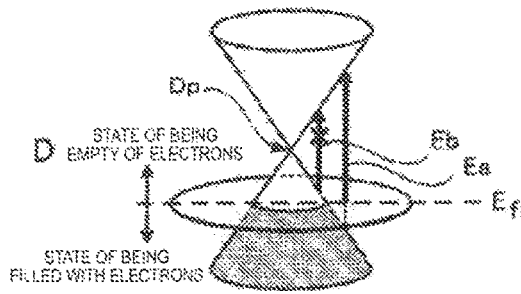

Graphene has the characteristic that the light transmittance changes by application of a voltage, as described above. Variations of the forbidden band based on variations of the Fermi level $E_f$ in the band structure of graphene are schematically shown in FIG. 11A. FIG. 11B, FIG. 11C, and FIG. 11D.

As shown in FIG. 11A, unlike common semiconductors, graphene is a zero-gap semiconductor in which the valence band and the conduction band have a linear dispersion relation with the Dimer point Dp as the point of symmetry. The Fermi level $E_f$ usually exists at the Dirac point Dp, but can be shifted by application of a voltage or doping treatment.

For example, when the Fermi level $E_f$ is shifted by application of a voltage or doping treatment as shown in FIG. 11B, the optical transitions of energies larger than 2|$\Delta E_f$| are possible as illustrated by arrow $E_a$, for example. On the other hand, as illustrated by arrow $E_b$, the optical transitions of ene gies of 2|$\Delta E_f$| or less can be forbidden. That is, graphene is transparent to light having an energy of 2$\Delta E_f$| or less. Thus, in graphene, the light transmittance for light of a desired wavelength (frequency) can be changed (controlled) by shifting the Fermi level $E_f$. As shown in FIG. 11C, when graphene is doped with an n-type impurity, the Fermi level Er can be shifted from the Dirac point Dp to the conduction band side. On the other hand, as shown in FIG. 11D, when graphene is doped with a p-type impurity, the Fermi rank $E_f$ can be shifted from the Dirac point Dp to the valence band side.

Figure 12:
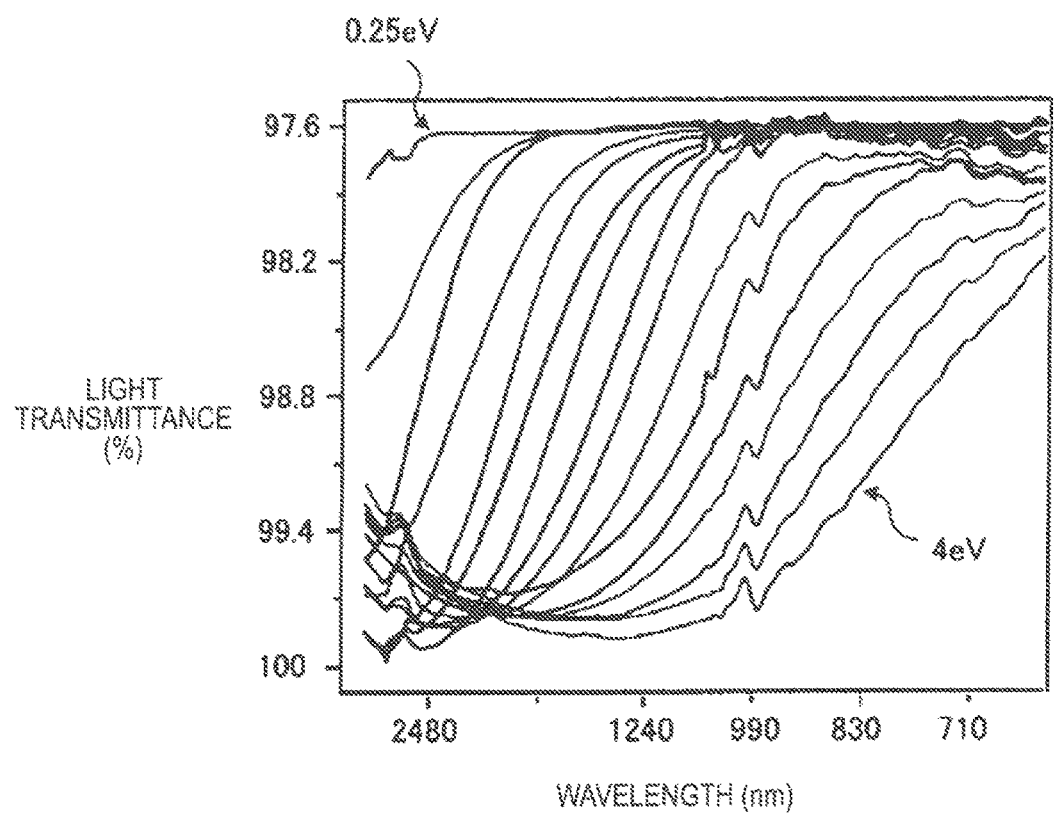
FIG. 12 is a diagram showing the light transmittance change in the infrared region when one layer of graphene in a film firm is sandwiched by a pair of electrodes and the applied voltage is changed.
Figure 13:
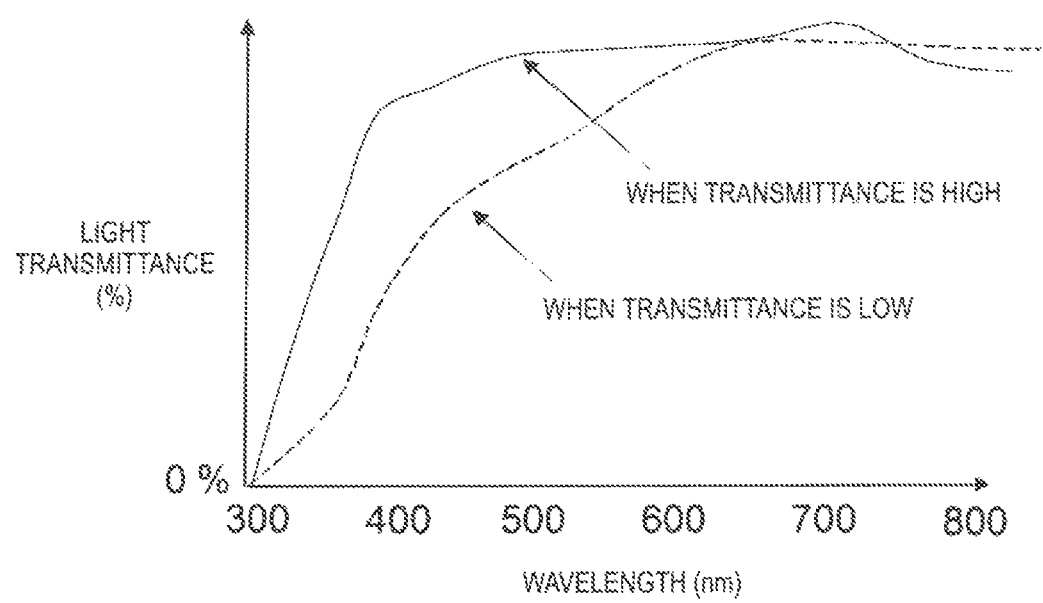
FIG. 13 is a schematic diagram showing the wavelength dependence of the light transmittance of an electrochromic film.

It is reported by Chen et al. that, when a voltage is applied to graphene, the light transmittance in the infrared region changes (Nature 471, 617-620 (2011)). The experimental results in the report are shown in FIG. 12. In FIG. 12, the light transmittance change in the infrared region when one layer of graphene in a film form is sandwiched by a pair of electrodes and the applied voltage is changed is shown, where the horizontal axis represents the wavelength (nm) and the vertical axis represents the light transmittance (%).

As shown in FIG. 12, the applied voltage is changed in a range of 0.25 eV to 4 eV. On the vertical axis of the graph, the bottom stands for the light transmittance being 100%, and the top stands for the light transmittance being 97.6% (the amount that one layer of graphene absorbs). From FIG. 12, it is found that, when the applied voltage is changed to the higher side in the entire wavelength region measured, the light transmittance comes closer to 100% in the region of long wavelengths than in the region of short wavelengths. Furthermore, since the region where the light transmittance comes close to 100% expands to the short wavelength side as the applied voltage becomes higher, it is found that the wavelength region of light in which the light transmittance can be modulated (controlled) by the applied voltage can be expanded to the short wavelength side. The above results are results in one layer of atoms; thus, based on the magnitude of the applied voltage, the light transmittance can be changed in accordance with the wavelength from the near-infrared region to the infrared region to the terahertz region.

These characteristics are common to, as well as graphene, other nanocarbon materials such as carbon nanotubes.

Embodiment 1

Embodiment 1 relates to a light control device (light control element) according to the first aspect of the present disclosure and a light transmittance control method for a light control device according to the first aspect of the present disclosure. As shown in the schematic partial cross-sectional view in FIG. 1A, a light control device (light control element) $10_1$ of Embodiment 1 includes a pair of electrodes 11 and 12 and a light control layer 13 sandwiched by the pair of electrodes 11 and 12.

The light control layer 13 has a stacked structure of a first insulating layer 14, a first nanocarbon film 15 doped with an impurity of the first conductivity type or not doped with an impurity, a second nanocarbon film 16 doped with an impurity of the second conductivity type different from the first conductivity type or not doped with an impurity, and a second insulating layer 17. As (the state of impurity doping in the first nanocarbon film 15, the state of impurity doping in the second nanocarbon film 16), four states of (a state where the first nanocarbon film 15 is doped with an impurity of the first conductivity type, a state where the second nanocarbon film 16 is doped with an impurity of the second conductivity type), (a state where the first nanocarbon film 15 is doped with an impurity of the first conductivity type, a state where the second nanocarbon film 16 is not doped with an impurity), (a state where the first nanocarbon film 15 is not doped with an impurity, a state where the second nanocarbon film 16 is doped with an impurity of the second conductivity type), and (a state where the first nanocarbon film 15 is not doped with an impurity, a state where the second nanocarbon film 16 is not doped with an impurity) can be given. Specifically, in Embodiment 1, the first nanocarbon film 15 is doped with an impurity of the first conductivity type (more specifically, the n-type), and the second nanocarbon film 16 is doped with an impurity of the second conductivity type (more specifically, the p-type).

Here, the first nanocarbon film 15 and the second nanocarbon film 16 are formed of graphene. A first electrode 11 and a second electrode 12 that form a pair of electrodes are formed of a nanocarbon film, specifically one layer of graphene. The first insulating layer 14 and the second insulating layer 17 are made of $SiO_2$, SiN, $TiO_2$, $SrTiO_3$, or the like.

In the light control device of Embodiment 1, a voltage is applied to the pair of electrodes 11 and 12 to control the amount of charge generated in the first nanocarbon film 15 and/or the second nanocarbon film 16; thus, the light transmittance in the light control layer 13 is controlled. Since two layers of the first nanocarbon film 15 and the second nanocarbon film 16 are stacked and the light transmittance modulation range per layer of graphene is approximately 2%, the light transmittance modulation range (the range of change in light transmittance) ΔT of the light control device of Embodiment 1 is approximately 4%.

Figure 1B:
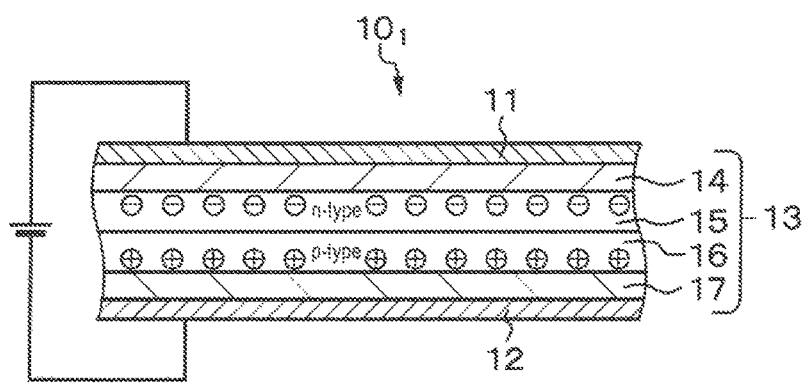
FIG. 1B is a conceptual diagram showing the behavior of a first nanocarbon film and a second nanocarbon film when a voltage is applied to a pair of electrodes of the light control device of Embodiment 1.

Specifically, a voltage higher than the voltage applied to the second electrode 12 facing the second nanocarbon film 16 via the second insulating layer 17 is applied to the first electrode 11 facing the first nanocarbon film 15 via the first insulating layer 14 (see FIG. 1B). The second nanocarbon film 16 and the second insulating layer 17 are in an electrically floating state. Hence, a negative charge is induced in the first nanocarbon film 15, and a positive charge is induced in the second nanocarbon film 16 (see FIG. 1B). Here, since the first nanocarbon film 15 is doped with an n-type impurity and the second nanocarbon film 16 is doped with a p-type impurity, a p-n junction is formed at the interface between the first nanocarbon film 15 and the second nanocarbon film 16. Therefore, a depletion layer is formed between the first nanocarbon film 15 and the second nanocarbon film 16 while a reverse bias voltage is applied to the pair of electrodes 11 and 12; thus, a charge is retained in each of the first nanocarbon film 15 and the second nanocarbon film 16. As a result of the above, the wavelength band of light that can pass through (be transmitted through) the light control layer 13 at a high light transmittance is determined.

Figure 1C:
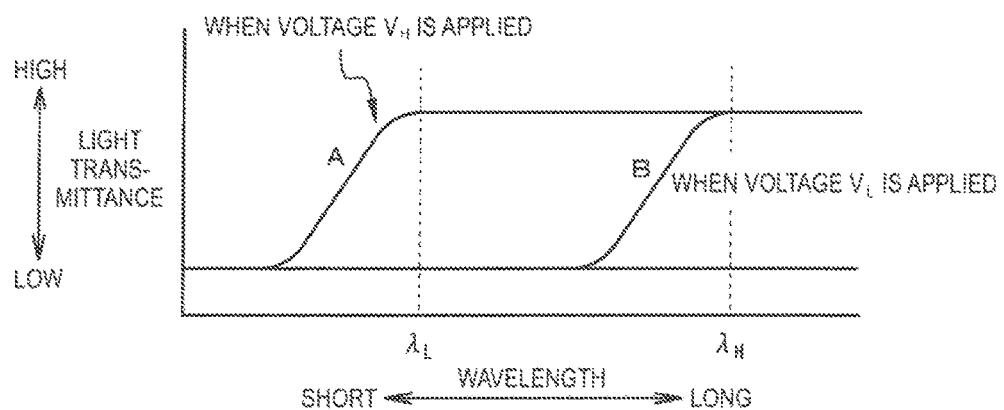
FIG. 1C is a conceptual diagram showing relationships between the light transmittance of a light control layer and the wavelength band of light that has passed through the light control device when voltages are applied to the pair of electrodes of the light control device of Embodiment 1.

Specifically, when a high first voltage $V_H$ is applied between the pair of electrodes 11 and 12, the relationship between the light transmittance of the light control layer 13 and the wavelength of light that has passed through the light control device is in the state of "A" in the conceptual diagram of FIG. 1C. On the other hand, when a low second voltage $V_L$ ($V_L<V_H$) is applied between the pair of electrodes 11 and 12, the relationship between the light transmittance of the light control layer 13 and the wavelength of light that has passed through the light control device is in the state of "B" in the conceptual diagram of FIG. 1C. Thereby, in the time of the application of the first voltage $V_H$ between the pair of electrodes 11 and 12, light of wavelengths not less than a wavelength $\lambda_L$ is allowed to pass (be transmitted) at a higher light transmittance than light of wavelengths less than the wavelength $\lambda_L$ (see the state of "A" in the conceptual diagram of FIG. 1C). Furthermore, in the time of the application of the second voltage $V_L$ between the pair of electrodes 11 and 12, light of wavelengths not less than a wavelength $\lambda_H$ (provided that $\lambda_H>\lambda_L$) is allowed to pass (be transmitted) at a higher light transmittance than light of wavelengths less than the wavelength $\lambda_H$ (the state of "B" in the conceptual diagram of FIG. 1C). That is, the relationship between the light control state of the light control device and the wavelength band of light can be controlled in accordance with the voltage applied to the pair of electrodes 11 and 12. Specifically, the voltage applied to the pair of electrodes 11 and 12 is a pulsed voltage. The light transmittance in the light control layer 13 is controlled by changing the duty ratio of the pulsed voltage.

A light transmittance control method of Embodiment 1 is a light transmittance control method for a light control device (light control element) in which light of wavelengths not less than the wavelength $\lambda_0$ is allowed to pass (be transmitted) at a higher light transmittance than light of wavelengths less than the wavelength $\lambda_0$ by applying a prescribed voltage $V_0$ between the pair of electrodes 11 and 12. The effective light transmittance of the light control layer 13 for light of wavelengths not less than the wavelength $\lambda_0$ is controlled by changing the duty ratio D of the pulsed prescribed voltage $V_0$.

Figure 2A:
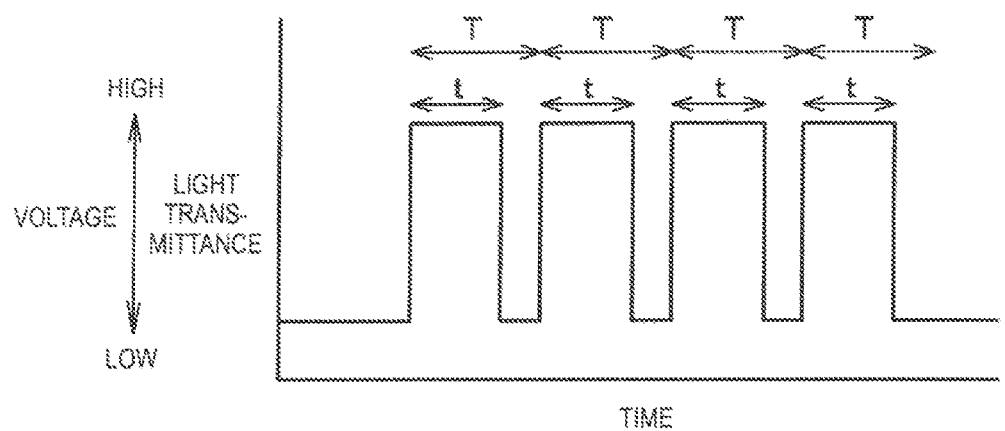
FIG. 2A is a diagram schematically showing the prescribed voltage $V_0$ and the change in light transmittance when a pulsed prescribed voltage $V_0$ is applied to the light control device.
Figure 2B:
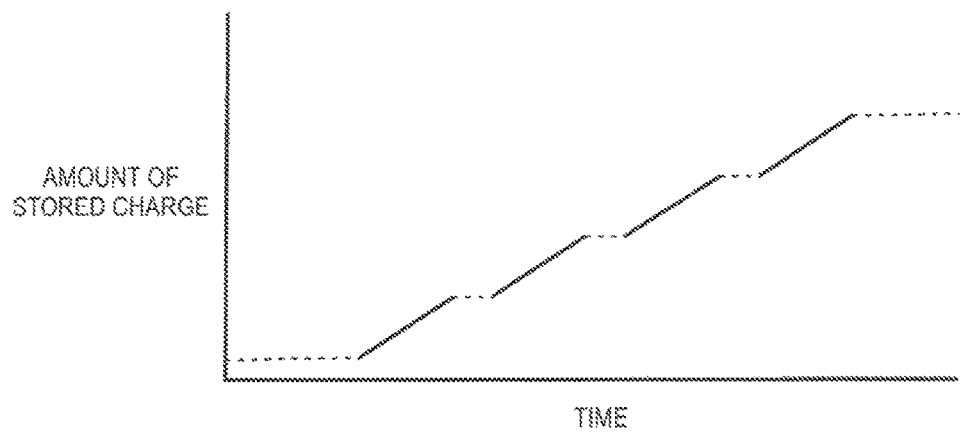
FIG. 2B is a diagram schematically showing the amount of charge stored in one frame period when the pulsed prescribed voltage $V_0$ is applied to the light control device.
Figure 3A:
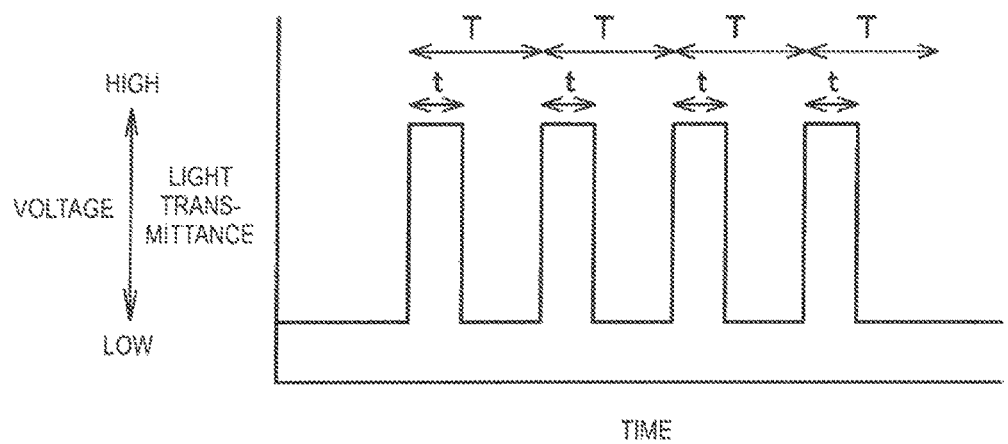
FIG. 3A is a diagram schematically showing the prescribed voltage $V_0$ and the change in light transmittance when a pulsed prescribed voltage $V_0$ is applied to the light control device.
Figure 3B:
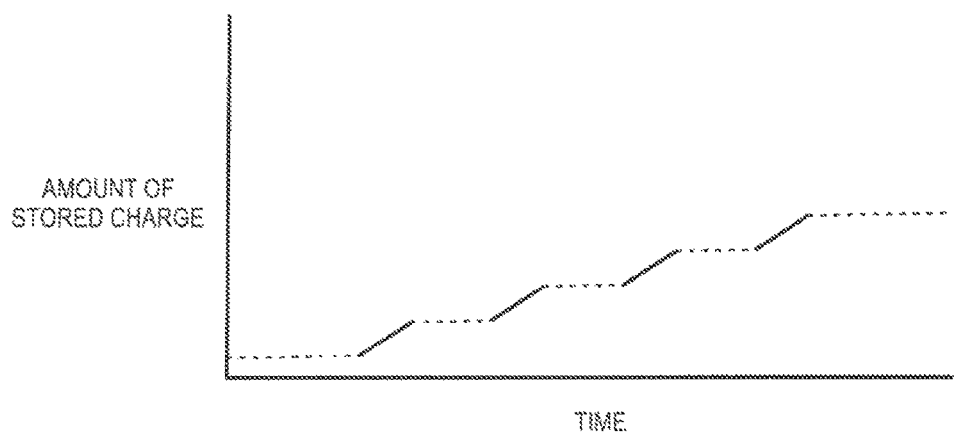
FIG. 3B is a diagram schematically showing the amount of charge stored in one frame period when the pulsed prescribed voltage $V_0$ is applied to the light control device.

Specifically, the voltage change (or light transmittance) when a prescribed voltage $V_0$ with a pulse period of T and a duty ratio of D=t/T is applied to the pair of electrodes 11 and 12 of the light control device is shown in FIG. 2A and FIG. 3A, and the amount of charge stored in the light receiving element in a certain period (e.g. one frame period) on the basis of light that has passed through the light control device is shown in FIG. 2B and FIG. 3B. As shown in the graphs of FIG. 2A and FIG. 3A, the light transmittance of the light control device is higher in the period t than in the period (T~t). Hence, a larger amount of charge can be obtained.

Therefore, as shown in FIG. 2B and FIG. 3B, the amount of stored charge is larger in the period t than in the period (T~t). The duty ratio D is a higher value in the example shown in FIG. 2A than in the example shown in FIG. 3A. In FIG. 2B and FIG. 3B, the solid line indicates the amount of stored charge in the period t, and the dotted line indicates the amount of stored charge in the period (T~t). When the pulsed prescribed voltage $V_0$ is applied, the amount of stored charge obtained in one frame period is obtained by the integration of the amount of stored charge in the period t and the amount of stored charge in the period (T~t). Thus, the amount of stored charge obtained in one frame period can be changed by changing the duty ratio D of the pulsed prescribed voltage $V_0$ (see FIG. 2B and FIG. 3B). That is, the effective light transmittance of the light control layer 13, that is, the average light transmittance of the light control layer in a certain period can be controlled. More specifically, when the quantity of light that has passed through the light control layer 13 in a certain period when the light transmittance of the light control layer 13 is maximized is denoted by $Q_0$ and the quantity of light that has passed through the light control layer 13 in the certain period when the prescribed voltage $V_0$ with a duty ratio of D=t/T is applied is denoted by $Q_1$, the effective light transmittance of the light control layer 13 can be expressed as $(Q_1/Q_0)$. As a result of the above, the dynamic range of the imaging element and the imaging device described later can be expanded, and the amounts of information of both bright portions and dark portions can be obtained during imaging.

In the light transmittance control method of Embodiment 1, the value obtained by converting the change in light transmittance of the nanocarbon film in the light control layer to frequency is higher than the frequency of the pulsed voltage. Specifically, the value obtained by converting the change in light transmittance of the nanocarbon film in the light control layer to frequency is $2.4 \times 10^3$ Hz (2.4 kHz), and the frequency of the pulsed prescribed voltage $V_0$ is, but not limited to, 240 Hz, for example. That is, $T=4.2 \times 10^{-3}$ seconds, for example.

The light transmittance control method of Embodiment 1 can be used for the light control device of Embodiment 2 described later, and can be used for the imaging element and the imaging device of Embodiment 3 and Embodiment 4 described later; but not limited to them, can be used for various light control devices and various imaging elements and imaging devices including a light control device.

Graphene can be formed by the manufacturing method described below, for example. That is, a film containing a graphene-izing catalyst is formed as a film on a base. Then, a gas-phase carbon supply source is supplied to the film containing a graphene-izing catalyst, and at the same time the gas-phase carbon supply source is heat-treated; thereby, graphene is produced. After that, the graphene is cooled at a prescribed cooling rate; thus, graphene in a film form can be formed on the film containing a graphene-izing catalyst. As the graphene-izing catalyst, as well as carbon compounds such as SiC, at least one metal selected from Ni, Co, Fe, Pt, Au, Al, Cr, Cu, Mg, Mn, Mo, Rh, Si, Ta, Ti, W, U, V, and Zr may be given. As the gas-phase carbon supply source, for example, at least one carbon source selected from carbon monoxide, methane, ethane, ethylene, ethanol, acetylene, propane, butane, butadiene, pentane, a pentene, cyclopentadiene, hexane, cyclohexane, benzene, and toluene may be given. The graphene in a film form thus formed is separated from the film containing a graphene-izing catalyst; thus, graphene can be obtained.

Specifically, to manufacture the light control device in Embodiment 1, for example, rolled copper foil with a thickness of 18 μm is heated at 1000° C. in a hydrogen atmosphere (the flow rate of hydrogen: 20 sccm) in an electric furnace, and methane gas is supplied for 30 minutes at a flow rate of 30 sccm; thereby, the first nanocarbon film 15 made of graphene is formed on the copper foil. Subsequently, a dopant layer is formed on the graphene. Then, the first insulating layer 14 of a base in which the first electrode 11 and the first insulating layer 14 are formed and the first nanocarbon film 15S are attached together, and the copper foil is removed using an iron nitrate aqueous solution. On the other hand, similarly, rolled copper foil with a thickness of 18 μm is heated at 1000° C. in a hydrogen atmosphere (the flow rate of hydrogen: 20 sccm) in an electric furnace, and methane gas is supplied for 30 minutes at a flow rate of 30 scorn; thereby, the second nanocarbon film 16 made of graphene is formed on the copper foil, for example. Subsequently, a dopant layer is formed on the graphene, and the second insulating layer 17 is formed. Then, a solution in which poly(methyl methacrylate) (PMMA) is diluted with acetone is applied onto the second insulating layer 17 by spin coating, and then the solution is dried to form a PMMA film. After that, the copper foil is removed using an iron nitrate aqueous solution, the second nanocarbon film 16 attached to the PMMA film is transferred onto the first nanocarbon film 15, and then the PMMA film is removed using acetone solvent. Thus, a stacked structure of the first insulating layer 14, the first nanocarbon film 15 and the second nanocarbon film 16 made of graphene, and the second insulating layer 17 can be obtained. An imaging element is formed on the base beforehand, for example. In each film formation process, also a method of continuously forming a film based on a roll-to-roll system, a method of continuously forming graphene into a film while heating an electrode locally, etc. may be used, for example.

In the light control device (light control element) of Embodiment 1, when a voltage is applied to the pair of electrodes, a positive or negative charge is induced in either one of the first nanocarbon film and the second nanocarbon film and a negative or positive charge is induced in the other in accordance with the polarity of the applied voltage. Consequently, the wavelength band of light that can pass through the light control layer at a high light transmittance is determined. That is, the light transmittance of the light control layer in a desired wavelength band can be controlled. In addition, since the first nanocarbon film is doped with an impurity of the first conductivity type and the second nanocarbon film is doped with an impurity of the second conductivity type, a p-n junction is formed at the interface between the first nanocarbon film and the second nanocarbon film, and a charge is retained in each of the first nanocarbon film and the second nanocarbon film while a reverse bias voltage is applied to the pair of electrodes. In the light transmittance control method for a light control device (light control element) of Embodiment 1, the value of the wavelength $\lambda_0$ may be set to, for example, blue color (specifically 380 nm) and setting may be made so that the light transmittance for light of wavelengths not less than the wavelength $\lambda_0$ (specifically, light having a wavelength band of visible light or more) when the prescribed voltage $V_0$ is applied is at a maximum (e.g. almost 100%); thereby, the control of a desired light transmittance can be performed accurately and easily. Furthermore, low power consumption can be achieved because a current does not flow between the pair of electrodes; and in the nanocarbon film, there is no wavelength dependence of light transmittance, the transmission spectrum is flat, the hues are neutral, and the time required for the change in light transmittance is short. Furthermore, mechanical driving is not needed; thus, the structure can be simplified, and height reduction (thickness reduction) and miniaturization are easy.

Embodiment 2

Figure 4:
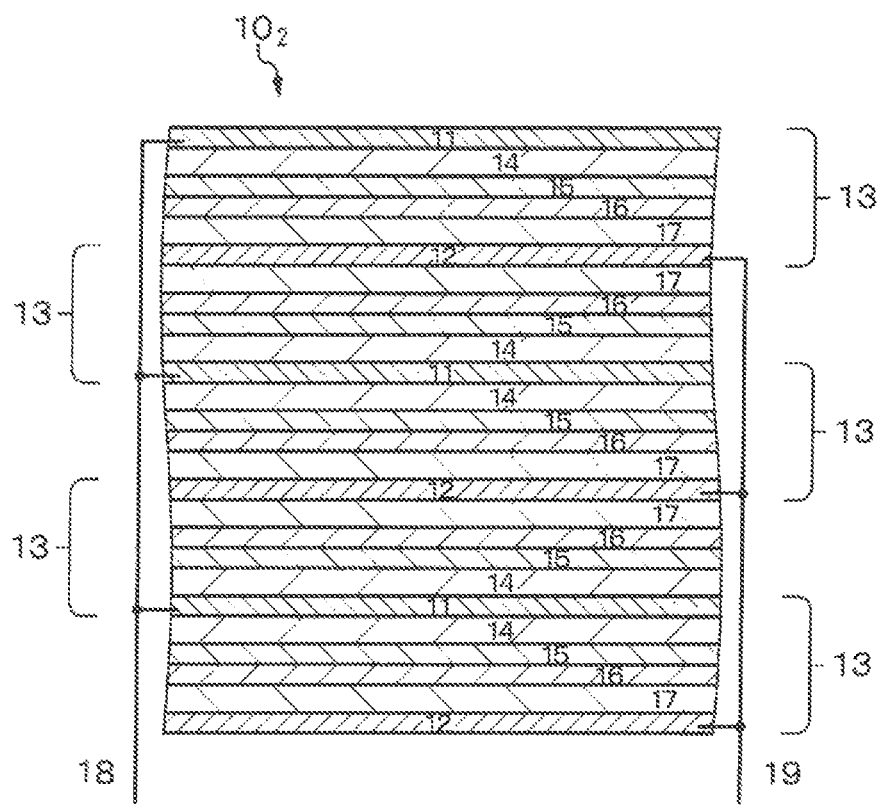
FIG. 4 is a schematic partial end view of a light control device of Embodiment 2.

Embodiment 2 is a modification of Embodiment 1. As shown in the schematic partial cross-sectional view in FIG. 4, in a light control device (light control element) $10_2$ of Embodiment 2, N (in the illustrated example, N=5) light control layers and (N+1) electrodes are provided, the N light control layers and the (N+1) electrodes are alternately stacked, and the electrodes in odd positions are connected to a first interconnection 18 and the electrodes in even positions are connected to a second interconnection 19.

Specifically, the light control device $10_2$ has a structure of a first electrode 11, a first insulating layer 14, a first nanocarbon film 15, a second nanocarbon film 16, a second insulating layer 17, a second electrode 12, a second insulating layer 17, a second nanocarbon film 16, a first nanocarbon film 15, a first insulating layer 14, a first electrode 11, a first insulating layer 14, a first nanocarbon film 15, a second nanocarbon film 16, a second insulating layer 17, a second electrode 12, etc. That is, the stacking order of the first insulating layer, the first nanocarbon film, the second nanocarbon film, and the second insulating layer is opposite between the light control layers in odd positions and the light control layers in even positions. By employing such a configuration, a structure in which the light control layer 13 of Embodiment 1 is stacked in N layers as a whole is created, and the range of change in light transmittance can be expanded.

It is also possible to separate the N light control layers into groups each composed of N' layers of light control devices, and to connect one electrode to the first interconnection 18 and connect the other electrode to the second interconnection in each group of light control devices.

Embodiment 3

Embodiment 3 relates to an imaging element and an imaging device according to the first aspect of the present disclosure. Imaging elements $R_1$, $G_1$, and $B_1$ of Embodiment 3 are formed of a light receiving element (photosensor, photodiode, or photoelectric conversion element) 27 and the light control device 10 or $10_2$ described in Embodiment 1 or Embodiment 2 which is disposed on the light incidence side of the light receiving element. An imaging device of Embodiment 3 includes imaging elements $R_1$, $R_0$, $G_1$, $G_0$, $B_1$, and $B_0$ arranged in a two-dimensional matrix configuration, and at least parts $R_1$, $G_1$, and $B_1$ of the imaging elements arranged in a two-dimensional matrix configuration are formed of a light receiving element (photoelectric conversion element) and a light control device (light control element) 21 disposed on the light incidence side of the light receiving element. That is, at least the parts $R_1$, $G_1$, and $B_1$ of the imaging elements arranged in a two-dimensional matrix configuration are formed of the imaging elements $R_1$, $G_1$, and $B_1$ of Embodiment 3.

Figure 5A:
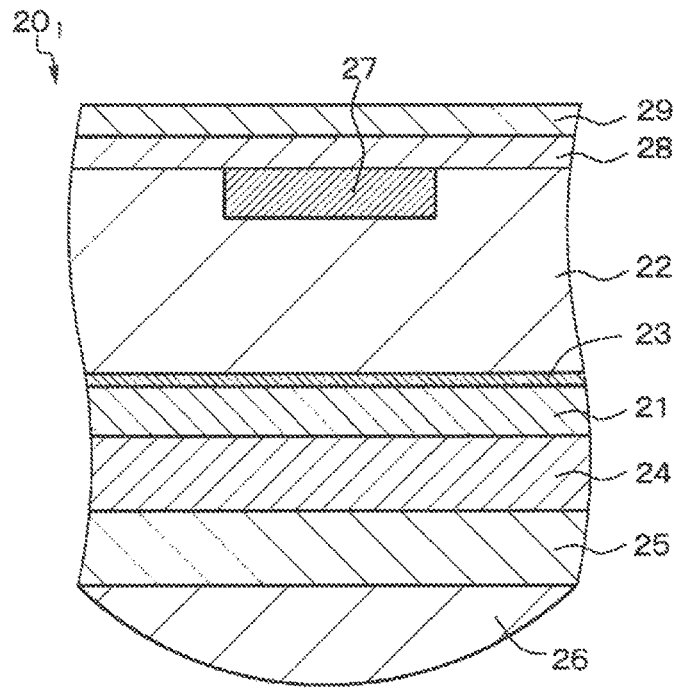
FIG. 5A and FIG. 5B are schematic partial cross-sectional views of imaging elements of Embodiment 3.
Figure 5B:
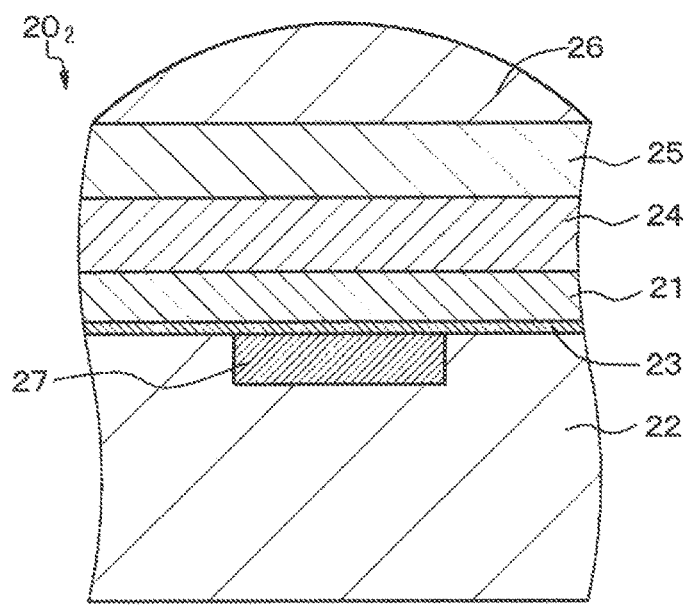

Schematic partial cross-sectional views of imaging elements of Embodiment 3 are shown in FIG. 5A and FIG. 5B. Layouts of imaging element groups are schematically shown in FIG. 6A, FIG. 6B, FIG. 7A, FIG. 7B, and FIG. 8A. Here, an imaging element $20_1$ shown in FIG. 5A is a back-side illumination imaging element, and an imaging element $20_2$ shown in FIG. 5B is a front-side illumination imaging element. The imaging elements $R_1$, $R_0$, $G_1$, $G_0$, $B_1$, and $B_0$ are arranged based on the Bayer arrangement, for example.

The imaging elements $20_1$ and $20_2$ have a structure in which a silicon semiconductor substrate 22, an interlayer insulating film 23 made of $SiO_2$, the light control device 21 ($10_1$ or $10_2$) of Embodiment 1 or Embodiment 2, a protective film 24, a color filter layer (or a transparent film) 25, and a condensing lens (on-chip lens) 26 are stacked. The light receiving element 27 is formed in a front surface portion of the silicon semiconductor substrate 22. In the back-side illumination imaging element $20_1$, the stacked structure of the light control device 21 etc. is formed on the back surface side of the silicon semiconductor substrate 22; and in the front-side illumination imaging element $20_2$, the stacked structure of the light control device 21 etc. is formed on the front surface side of the silicon semiconductor substrate 22. In the back-side illumination imaging element $20_1$, an interlayer insulating layer 28 made of $SiO_2$ and a protective film 29 are formed on the front surface side of the silicon semiconductor substrate 22. The incident light is photoelectrically converted in the light receiving element 27 to generate a signal charge, and the signal charge is stored. The first interconnection and the second interconnection are disposed in the light control device 21, but the illustration of the first interconnection and the second interconnection is omitted. The configuration and structure of the back-side illumination imaging element $20_1$ and the front-side illumination imaging element $20_2$ may be a known configuration and a known structure except for the light control device 21, and a detailed description is omitted. Also the imaging device itself may be a similar configuration to a known imaging device, and also the method for driving the imaging element and the method for driving the imaging device may be known driving methods; and a detailed description is omitted. The imaging element of Embodiment 3 can achieve height reduction (thickness reduction); thus, an imaging element and an imaging device that have high sensitivity and in which color mixing between pixels aid sensitivity shading are at a low level can be obtained.

Figures 6A, 6B:
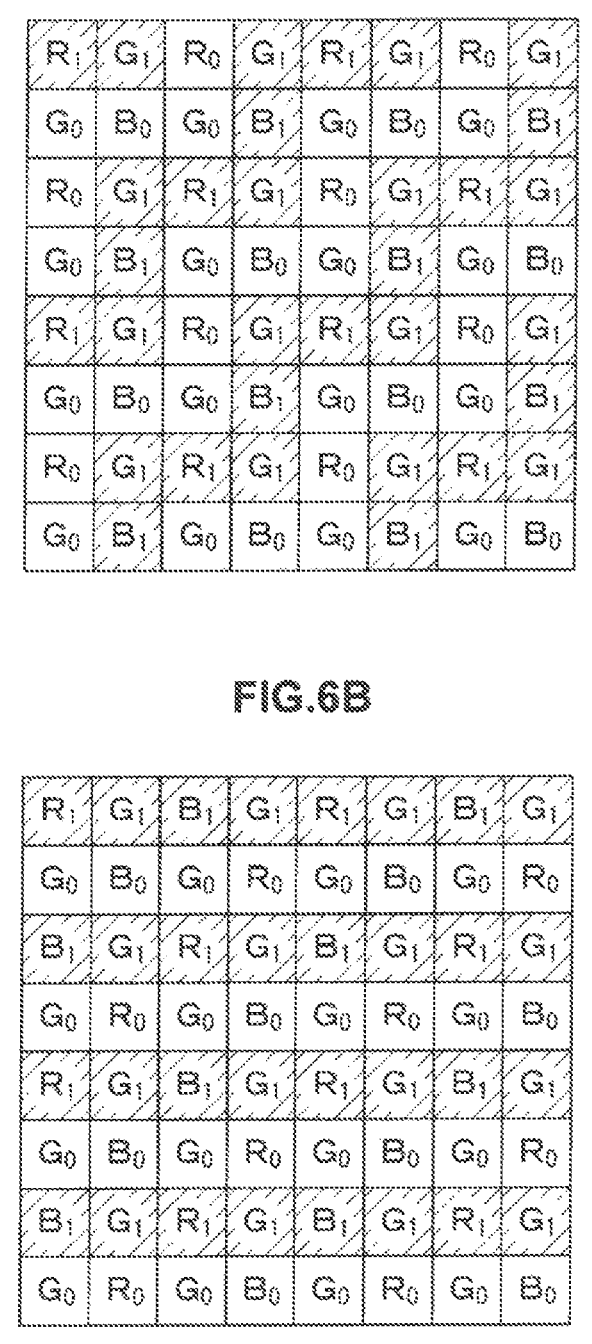
Figures 7A, 7B:
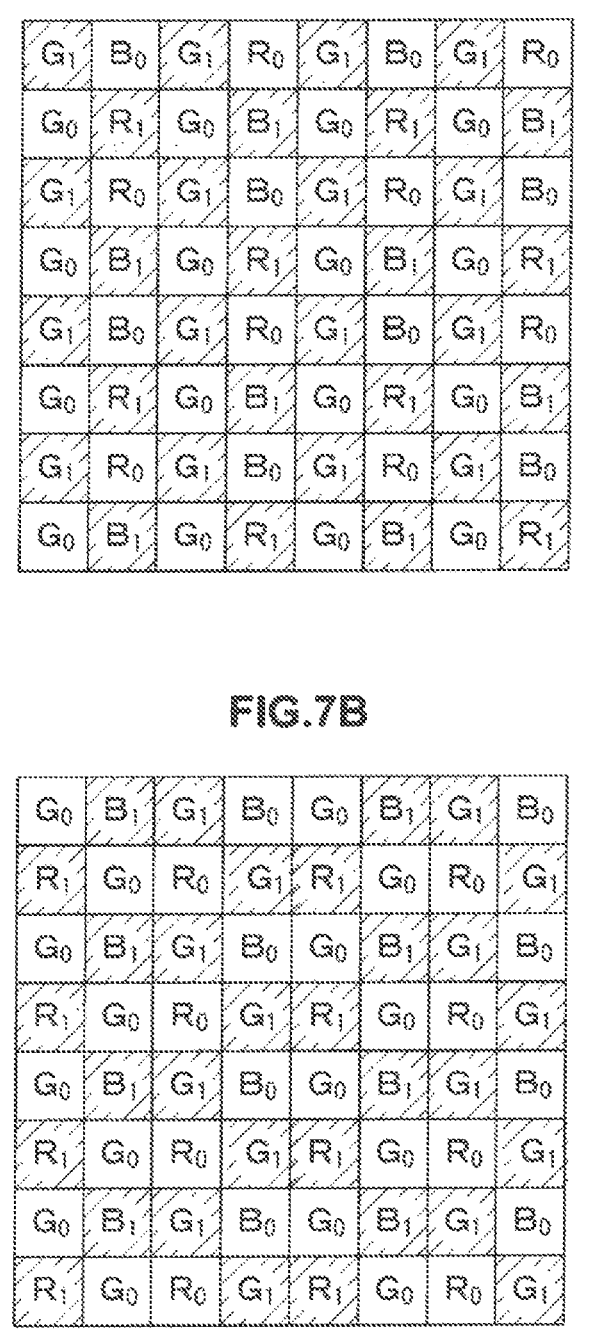

In FIG. 6A, FIG. 6B, FIG. 7A, FIG. 7B, and FIG. 8A, "$R_0$" and "$R_1$" are an imaging element in which a red color filter layer is formed, and receive red light. Such an imaging element is referred to as a "red imaging element" for the sake of convenience. Furthermore, "$G_0$" and "$G_1$" are an imaging element in which a green color filter layer is formed, and receive green light. Such an imaging element is referred to as a "green imaging element" for the sake of convenience. Furthermore, "$B_0$" and "$B_1$" are an imaging element in which a blue color filter layer is formed, and receive blue light. Such an imaging element is referred to as a "blue imaging element" for the sake of convenience. In the examples illustrated, one red imaging element, two green imaging elements, and one blue imaging element constitute one unit imaging element group, and 16 unit imaging element groups are illustrated in FIG. 6A, FIG. 6B. FIG. 7A, FIG. 7B, and FIG. 8A. In the imaging elements $R_0$, $G_0$, and $B_0$, the light control device 21 is not provided, and instead a planarization film (not illustrated) made of a polystyrene-based resin or an acrylic resin is provided. When the thickness of the light control device 21 is sufficiently small, it is not necessary to provide a planarization film. On the other hand, the light control device 21 is provided in the imaging elements $R_1$, $G_1$, and $B_1$. The dynamic range can be expanded by using such imaging elements and applying, for example, signal processing of a spatially varying exposure (SVE) system disclosed in WO 2002/056604 to the imaging elements.

The light control device $10_1$ absorbs 2.3×2=4.6% of the light per light control device when a voltage is not applied. Therefore, when, for example, N=30 in the light control device $10_2$, the light transmittance as the whole light control device 21 when a voltage is not applied is 25%. On the other hand, by applying a prescribed voltage $V_0$, the light transmittance as the whole light control device 21 becomes a value close to 100%. As described above, the amount of stored charge obtained in one frame period can be changed by changing the duty ratio D of the prescribed voltage $V_0$.

The dynamic range is expressed by the ratio between the amount of saturation signal which is the maximum amount of signal, and the noise. When the dynamic range is larger, signals in bright scenes and signals in dark scenes can be obtained more reliably. In the imaging element of Embodiment 3, the imaging elements $R_1$, $G_1$, and $B_1$ including the light control device 21 and the imaging elements $R_0$, $G_0$, and $B_0$ not including the light control device 21 are provided; and by controlling the value and duty ratio D of the prescribed voltage $V_0$ applied to the light control device 21 or not applying a voltage to the light control device 21 to control the light transmittance or reduce the light transmittance to a desired value, the time until reaching the amount of saturation charge is made longer in the imaging elements $R_1$, $G_1$, and $B_1$ including the light control device 21 than in the imaging elements $R_0$, $G_0$, and $B_0$ not including the light control device 21. As a result of the above, the dynamic range can be expanded. On the other hand, by controlling the value and duty ratio D of the prescribed voltage $V_0$ applied to the light control device 21 to maximize the light transmittance, the imaging elements $R_1$, $G_1$, and $B_1$ including the light control device 21 can be made an imaging element having almost the same light transmittance as those of the imaging elements $R_0$, $G_0$, and $B_0$ not including the light control device 21; thus, there is no problem of resolution reduction. That is, for example, a user of the imaging device may switch or the imaging device may automatically switch between an imaging mode that attempts to expand the dynamic range and an imaging mode that focuses on the resolution; thereby, imaging in optimum imaging modes can be performed.

A pair of electrodes may be shared between imaging elements including the light control device. That is, a configuration in which the first electrode 11 in each light control device $10_1$ or $10_2$ is shared and similarly the second electrode 12 is shared between adjacent imaging elements may be employed; thereby, the configuration and structure of the imaging elements can be simplified. Also a configuration in which a pair of electrodes shared between the imaging elements $R_1$, $G_1$, and $B_1$ including the light control device are provided to be also shared with the imaging elements $R_0$, $G_0$, and $B_0$ not including the light control device is possible; also by this, the configuration and structure of the imaging elements can be simplified. Specifically, in these cases, the first electrode 11 and the second electrode 12 are configured as what is called a solid electrode between imaging elements. When the first electrode 11 and the second electrode 12 are formed of graphene, light is absorbed also in the first electrode 11 and the second electrode 12; but the absorption is at 4% at most, and the amount of light absorption is smaller than when the first electrode 11 and the second electrode 12 are formed of a transparent conductive material layer made of ITO or the like. Although the light control device 21 is disposed in a region between the color filter layer 25 and the silicon semiconductor substrate 22, the light control device 21 may be disposed in a region between the color filter layer 25 and the condensing lens 26.

Embodiment 4

Embodiment 4 is a modification of Embodiment 3. In Embodiment 4, as illustrated in the layout of imaging element groups schematically shown in FIG. 8B, the red imaging element $R_0$, the green imaging element $G_0$, and the blue imaging element $B_0$, and an imaging element $IR_1$ that receives infrared light (referred to as an "infrared imaging element $IR_1$" for the sake of convenience) are provided. The imaging elements $R_0$, $G_0$, and $B_0$ do not include the light control device 21. On the other hand, the infrared imaging element $IR_1$ includes the light control device 21. The imaging elements $R_0$, $G_0$, $B_0$, and $IR_1$ constitute a unit imaging element group. In FIG. 8B, four unit imaging element groups are illustrated. In the infrared imaging element $IR_1$, a color filter is not provided, and instead a transparent film that allows light in the entire wavelength region to pass is provided. The transparent film is a film for filling the level difference of the element surface occurring due to a color filter not being formed, and is provided as necessary. In the infrared imaging element $IR_1$, a light control device that allows light in the infrared band to pass can be obtained by appropriately selecting the prescribed voltage $V_0$ applied to the light control device 21.

Also in the imaging element and the imaging device of Embodiment 4, on the basis of the voltage applied to the light control device 21, the light transmittance of the light control device 21 can be changed and furthermore the wavelength region of passable light can be changed. In Embodiment 4, the dynamic range in the infrared imaging element $IR_1$ can be expanded.

In addition, by the infrared imaging element $IR_1$ being provided, a function of removing noise components due to dark current from the imaging elements $R_0$, $G_0$, and $B_0$ (noise cancellation function) can be provided. Here, the dark current is noise that occurs due to a charge generated by output current or heat even when light is completely blocked. In order to correct the dark current unevenness (that is, perform noise cancellation) in the imaging element, a light control device in which the light transmittance when a voltage is not applied is almost 0% and the light transmittance when a voltage is applied is almost 100% is used as the light control device 21. In this case, when a voltage is not applied to the light control device 21, since the infrared imaging element $IR_1$ does not allow light to pass, the signal component obtained is only a noise component $\Delta E$ due to dark current. The noise component due to dark current can be removed in each of the imaging elements $R_0$, $G_0$, and $B_0$ by subtracting the noise due to dark current from the signal component of each of the imaging elements $R_0$, $G_0$, and $B_0$.

Specifically, when a voltage is applied to the light control device 21 of the infrared imaging element $IR_1$, since the light transmittance of the light control device 21 is almost 100%, a signal component $S_{IR}$ in the infrared region or more is obtained. On the other hand, when a voltage is not applied to the light control device 21 of the infrared imaging element $IR_1$, since the light transmittance of the light control device 21 is almost 0%, only the noise component $\Delta E$ due to dark current is obtained. For example, in the green imaging element $G_0$, light passes through the green color filter layer and a signal component $S_G$ in the green region is obtained. Since the green imaging element $G_0$ also allows light in the infrared region to pass, the signal component $S_{IR}$ in the infrared region and the noise component $\Delta E$ due to dark current are added in the signal component read from the greed imaging element $G_0$. That is, the signal component $S_G'$ read from the green imaging element $G_0$ is $S_G$'=(signal component $S_G$ in the green region)+(signal component $S_{IR}$ in the infrared region or more)+(noise component $\Delta E$ due to dark current).

On the other hand, the signal component $S_{IR}$ and the noise component $\Delta E$ due to dark current are obtained from the infrared imaging element $IR_1$. Thus, the signal component $S_G$ in the green region can be obtained by subtracting the signal component $S_{IR}$ and the noise component $\Delta E$ due to dark current obtained from the infrared imaging element $IR_1$ from the signal component $S_G$' read from the green imaging element $G_0$. This similarly applies to the imaging elements $R_0$ and $B_0$. In Embodiment 4, since both the infrared component and the noise component $\Delta E$ can thus be removed from the imaging elements $R_0$, $G_0$, and $B_0$ using the signal components obtained in the infrared imaging element $IR_1$, it is not necessary to provide an IR cut filter on the upper side of the imaging elements $R_0$, $G_0$, and $B_0$, and the imaging element can be downsized and the number of manufacturing processes can be reduced.

In the case where an IR cut filter is provided on the upper side of the imaging elements $R_0$, $G_0$, and $B_0$, the noise component $\Delta E$ due to dark current can be removed. For example, in the green imaging element $G_0$, light passes through the green color filter layer and the signal component $S_G$ in the green region is obtained. In the green imaging element $G_0$, although light in the infrared region is absorbed by the IR cut filter, the noise component $\Delta E$ due to dark current is added in the signal component read from the green imaging element $G_0$. That is, the signal component $S_G$' read from the green imaging element $G_0$ is $S_G$'=(signal component $S_G$ in the green region)+(noise component $\Delta E$ due to dark current).

On the other hand, the noise component $\Delta E$ due to dark current is obtained from the infrared imaging element $IR_1$. Thus, the signal component $S_G$ in the green region can be obtained by subtracting the noise component $\Delta E$ due to dark current obtained from the infrared imaging element $IR_1$ from the signal component $S_G$' read from the green imaging element $G_0$. This similarly applies to the imaging elements $R_0$ and $B_0$.

A color filter layer may be provided in the infrared imaging element $IR_1$. An example in which a red color filter layer that allows red color to pass is provided will now be described. The infrared imaging element $IR_1$ like this is written as an "infrared imaging element IR-$R_1$." In this case, in the infrared imaging element IR-$R_1$, a signal component corresponding to light in the red region, which is a visible light component, is obtained by voltage application, along with a signal component corresponding to light in the infrared region. Hence, in the unit imaging element group, since there is no case where the number of imaging elements that receive visible light is reduced by providing the infrared imaging element IR-$R_1$, there is no problem of resolution reduction. Furthermore, since the effective light transmittance can be changed by voltage application, measures against resolution reduction in high sensitivity imaging are possible in dark scenes such as in the nighttime. Furthermore, since the infrared imaging element IR-$R_1$ serves as both the infrared imaging element $IR_1$ and a red imaging element that receives red light, in imaging in bright scenes, the signal degradation of the green imaging element $G_0$ can be compensated for using a high frequency component of the high resolution signal in the red region obtained in the infrared imaging element IR-$R_1$. That is, high frequency components with sharp color tones may be synthesized, and faded color tones can be corrected.

The output signal of the imaging element to be corrected can be expressed by the following formula.

Output signal = (signal of light received) +

($C_1$ × high frequency component of the red imaging element $R_0$) +

($C_2$ × high frequency component of the green imaging element $G_0$) +

($C_3$ × high frequency component of the blue imaging element $B_0$), where $C_1$, $C_{12}$, and $C_3$ are correction factors, and are determined by the signal of the position to be corrected. The signal of the green imaging element $G_0$ is corrected using the high frequency components by setting the correction factors to, for example, $C_1$=0.50, $C_2$=0.48, and $C_3$=0.02. The blurred portions of the image can be improved by this signal processing.

An example in which a green color filter layer that allows green color to pass is provided will be described next. The infrared imaging element $IR_1$ like this is written as an "infrared imaging element IR-$G_1$." In this case, in the infrared imaging element IR-$G_1$, a signal component corresponding to light in the green region, which is a visible light component, is obtained by voltage application to the light control device 21, along with a signal component corresponding to light in the infrared region. Hence, in the unit imaging element group, since there is no case where the number of imaging elements that receive visible light is reduced by providing the infrared imaging element IR-$G_1$, there is no problem of resolution reduction. Furthermore, since the effective light transmittance can be changed by voltage application, measures against resolution reduction in high sensitivity imaging are possible in dark scenes such as in the nighttime. Furthermore, since the infrared imaging element IR-$G_1$ serves as both the infrared imaging element $IR_1$ and a green imaging element that receives green light, imaging in the region of visible light to infrared light is possible with high resolution even in the nighttime etc. In addition, since the proportion of green imaging elements provided in the unit imaging element group is one half in the unit imaging element group, the resolution of green color can improve the apparent resolution. This is because the spectral sensitivity of the human eye peaks around green color, Alternatively, in the infrared imaging element $IR_1$, a light control device that allows light in the band of visible light to infrared light to pass can be obtained by appropriately selecting the prescribed voltage $V_0$ applied to the light control device 21. The infrared imaging element $IR_1$ like this is referred to as an "infrared imaging element IR-$W_1$" for the sake of convenience. In this case, the signal component read from the infrared imaging element IR-$W_1$ is a signal component in the infrared region, a signal component in the visible light region (white light), and the noise component $\Delta E$, or only the noise component $\Delta E$, in accordance with the presence or absence of application of a voltage to the light control device 21. That is, in the infrared imaging element IR-$W_1$, a signal component corresponding to white light is obtained by voltage application, along with a signal component corresponding to light in the infrared region. Thereby, there is no problem of resolution reduction due to providing the infrared imaging element IR-$W_1$; and in dark scenes such as in the nighttime, the problem of resolution reduction is eliminated because the effective light transmittance can be changed by voltage application. Furthermore, since the infrared imaging element IR-$W_1$ has the effects of both an infrared imaging element and a white imaging element, imaging in the region of visible light to near-infrared light is possible with high resolution even in the nighttime etc.

The light control device 21 may be provided in the red imaging element, the green imaging element, and the blue imaging element depending on circumstances. Furthermore, a red imaging element, a green imaging element, or a blue imaging element may be provided in place of the infrared imaging element.

Alternatively, the light control device may be made to function as a color filter, without providing a color filter layer. Specifically, the material of the first insulating layer 14 and the second insulating layer 17 in the light control device 21 provided in each of the red imaging element, the green imaging element, and the blue imaging element is varied. That is, for example, the first insulating layer 14 and the second insulating layer 17 in the infrared imaging element $IR_1$ are formed of $SiO_2$, the first insulating layer 14 and the second insulating layer 17 in the red imaging element $R_1$ are formed of $HfO_2$, the first insulating layer 14 and the second insulating layer 17 in the green imaging element $G_1$ are formed of $ZrO_2$, and the first insulating layer 14 and the second insulating layer 17 in the blue imaging element $B_1$ are formed of PLZT. When the relative permittivity of the material that forms the first insulating layer 14 and the second insulating layer 17 varies, the amount of charge induced in the first nanocarbon film 15 and the second nanocarbon film 16 varies, and consequently it becomes possible to change the value of $\lambda_0$ in the light control device that allows light of wavelengths not less than the wavelength $\lambda_0$ to pass (be transmitted) at a higher light transmittance than light of wavelengths less than the wavelength $\lambda_0$. Here, in the red imaging element $R_1$, signal components corresponding to light in the infrared region and the red region and the noise component $\Delta E$ are obtained. Similarly, in the green imaging element $G_1$, signal components corresponding to light in the infrared region to the green region and the noise component $\Delta E$ are obtained. In the blue imaging element $B_1$, signal components corresponding to light in the infrared region to the blue region and the noise component $\Delta E$ are obtained. Thus, the signal component in the red region in the red imaging element $R_1$ can be obtained by subtracting all the signal components obtained in the infrared imaging element $IR_1$ from all the signal components obtained in the red imaging element $R_1$. The signal component in the green region in the green imaging element $G_1$ can be obtained by subtracting all the signal components obtained in the red imaging element $R_1$ from all the signal components obtained in the green imaging element $G_1$. The signal component in the blue region in the blue imaging element $B_1$ can be obtained by subtracting all the signal components obtained in the green imaging element $G_1$ from all the signal components obtained in the blue imaging element $B_1$. In the infrared imaging element $IR_1$, the signal component in the infrared region can be obtained by subtracting the noise component $\Delta E$ of the imaging element $R_1$, $G_1$, or $B_1$ in a state where a voltage is not applied from all the signal components of the infrared imaging element $IR_1$. Such a modification example can be applied also to the imaging element described in Embodiment 3.

Embodiment 5

Embodiment 5 relates to a light control device (light control element) according to the second aspect of the present disclosure, a light transmittance control method for a light control device according to the second aspect of the present disclosure, an imaging element according to the second aspect of the present disclosure, and an imaging device according to the second aspect of the present disclosure. As shown in the schematic partial cross-sectional views in FIG. 9A and FIG. 9B, light control devices (light control elements) 5101 and 5102 of Embodiment 5 include a pair of electrodes 511 and 512 and a light control layer 513 sandwiched by the pair of electrodes, the light control layer 513 has a stacked structure of a first insulating layer 514, a nanocarbon film 515 or 516 doped with an impurity or not doped with an impurity, and a second insulating layer 517, and a voltage different from the voltage applied to the pair of electrodes 511 and 512 is applied to the nanocarbon films 515 and 516.

Figure 9A:
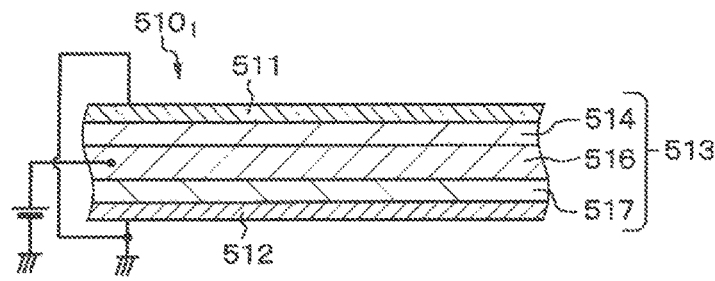
FIG. 9A and FIG. 9B are schematic partial end views of light control devices of Embodiment 5.
Figure 9B:
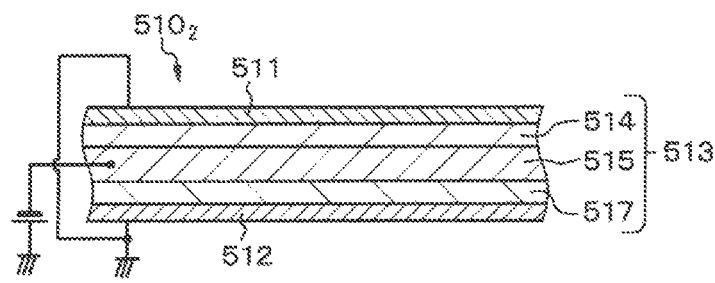

Specifically, as shown in FIG. 9A, the impurity is of the p-type, and a voltage higher than the voltage applied to the pair of electrodes 511 and 512 is applied to the nanocarbon film 516. Alternatively, as shown in FIG. 9B, the impurity is of the n-type, and a voltage lower than the voltage applied to the pair of electrodes 511 and 512 is applied to the nanocarbon film 515.

Similarly to Embodiment 1, the voltage applied to the nanocarbon films 515 and 516 is a pulsed voltage, and the light transmittance in the light control layer 513 is controlled by changing the duty ratio of the pulsed voltage. The value obtained by converting the change in light transmittance of the nanocarbon films 515 and 516 in the light control layer 513 to frequency is higher than the frequency of the pulsed voltage. The frequency of the pulsed voltage is preferably not less than $1 \times 10^2$ Hz and not more than $1 \times 10^5$ Hz. The nanocarbon films 515 and 516 are formed of graphene.

A light transmittance control method for a light control device of Embodiment 5 is a light transmittance control method for a light control device (light control element) in which a prescribed voltage $V_0$ different from the voltage applied to the pair of electrodes 511 and 512 is applied to the nanocarbon films 515 and 516 and thereby light of wavelengths not less than the wavelength $\lambda_0$ is allowed to pass at a higher light transmittance than light of wavelengths less than the wavelength $\lambda_0$. The effective light transmittance of the light control layer 513 for light of wavelengths not less than the wavelength $\lambda_0$ is controlled by changing the duty ratio of the pulsed prescribed voltage $V_0$.

An imaging element of Embodiment 5 is formed of a light receiving element and the light control device of Embodiment 5 disposed on the light incidence side of the light receiving element. An imaging device of Embodiment 5 includes imaging elements arranged in a two-dimensional matrix configuration, and at least part of the imaging elements arranged in a two-dimensional matrix configuration are formed of a light receiving element and the light control device of Embodiment 5 disposed on the light incidence side of the light receiving element.

Except for the points described above, the light control device (light control element) and the light transmittance control method for a light control device (light control element) of Embodiment 5 may be similar to the light control device (light control element) and the light transmittance control method for a light control device (light control element) described in Embodiment 1, and a detailed description is omitted. Furthermore, except for the points described above, the imaging element and the imaging device of Embodiment 5 may be similar to the imaging element and the imaging device described in Embodiment 3 and Embodiment 4, and a detailed description is omitted.

Embodiment 6

Figure 10:
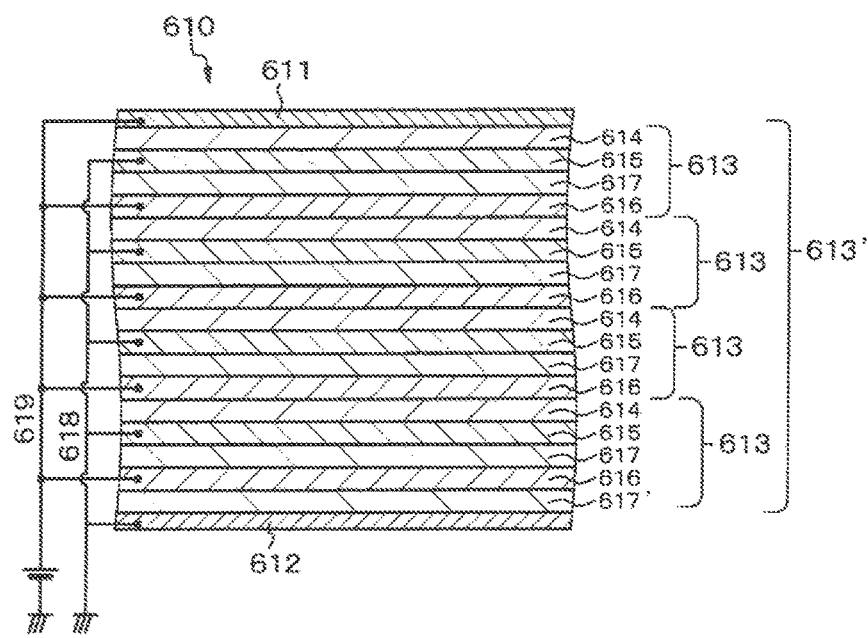
FIG. 10 is a schematic partial end view of a light control device of Embodiment 6.

Embodiment 6 relates to a light control device (light control element) according to the third aspect of the present disclosure, a light transmittance control method for a light control device according to the third aspect of the present disclosure, an imaging element according to the third aspect of the present disclosure, and an imaging device according to the third aspect of the present disclosure. As shown in the schematic partial cross-sectional view in FIG. 10, a light control device (light control element) 610 of Embodiment 6 includes a pair of electrodes 611 and 612 and a stacked structure body 613' in which M (provided that M≥2) light control layers 613 sandwiched by the pair of electrodes 611 and 612 are stacked, the m-th light control layer 613 (provided that 1≤m≤(M~1)) has a stacked structure of a first insulating layer 614, a first nanocarbon film 615 doped with an n-type impurity or not doped with an impurity, a second insulating layer 617, and a second nanocarbon film 616 doped with a p-type impurity or not doped with an impurity, the M-th light control layer 613 has a stacked structure of the first insulating layer 614, the first nanocarbon film 615 doped with an n-type impurity or not doped with an impurity, the second insulating layer 617, the second nanocarbon film 616 doped with a p-type impurity or not doped with an impurity, and a third insulating layer 617', and a voltage different from the voltage applied to the first nanocarbon film 615 is applied to the second nanocarbon film 616. Specifically, a voltage higher than the voltage applied to the first nanocarbon film 615 is applied to the second nanocarbon film 616.

A voltage not more than the voltage applied to the second nanocarbon film 616 and not less than the voltage applied to the first nanocarbon film 615 is applied to the pair of electrodes 611 and 612. The first nanocarbon films 615 are connected to a common first interconnection 618, and the second nanocarbon films 616 are connected to a common second interconnection 619.

Similarly to Embodiment 1, the voltage applied to the second nanocarbon film 616 and the first nanocarbon film 615 is a pulsed voltage, and the light transmittance in the light control layer 613 is controlled by changing the duty ratio of the pulsed voltage. The value obtained by converting the change in light transmittance of the nanocarbon films in the light control layer 613 to frequency is higher than the frequency of the pulsed voltage. The frequency of the pulsed voltage is preferably not less than $1 \times 10^2$ Hz and not more than $1 \times 10^5$ Hz. The nanocarbon films 615 and 616 are formed of graphene.

A light transmittance control method for a light control device of Embodiment 6 is a light transmittance control method for a light control device (light control element) in which a prescribed voltage $V_0$ (provided that the voltage applied to the second nanocarbon film 616 is different from the voltage applied to the first nanocarbon film 615, specifically, is higher than the voltage applied to the first nanocarbon film 615) is applied between the second nanocarbon film 616 and the first nanocarbon film 615 and thereby light of wavelengths not less than the wavelength $\lambda_0$ is allowed to pass at a higher light transmittance than light of wavelengths less than the wavelength $\lambda_0$. The effective light transmittance of the light control layer 613 for light of wavelengths not less than the wavelength $\lambda_0$ is controlled by changing the duty ratio of the pulsed prescribed voltage $V_0$.

An imaging element of Embodiment 6 is formed of a light receiving element and the light control device of Embodiment 6 disposed on the light incidence side of the light receiving element. An imaging device of Embodiment 6 includes imaging elements arranged in a two-dimensional matrix configuration, and at least part of the imaging elements arranged in a two-dimensional matrix configuration are formed of a light receiving element and the light control device of Embodiment 6 disposed on the light incidence side of the light receiving element.

Except for the points described above, the light control device (light control element) and the light transmittance control method for a light control device (light control element) of Embodiment 6 may be similar to the light control device (light control element) and the light transmittance control method for a light control device (light control element) described in Embodiment 1, and a detailed description is omitted. Furthermore, except for the points described above, the imaging element and the imaging device of Embodiment 6 may be similar to the imaging element and the imaging device described in Embodiment 3 and Embodiment 4, and a detailed description is omitted.

Hereinabove, the present disclosure is described based on preferred Embodiments, but the present disclosure is not limited to these Embodiments, The light control device according to the first aspect to the third aspect of the present disclosure may be configured as a shutter device. That is, the light control device described in Embodiment 1 and Embodiment 2 may be disposed so as to cover the entire light incidence side of the imaging device. Then, for example, the first electrode and the second electrode may be arranged in a simple matrix configuration; thus, the light transmittance in a desired region of the light control device that functions as a shutter device can be controlled. That is, by adjusting the light transmittance by applying a voltage, blocked-up shadows can be prevented in partially dark places. Furthermore, blown-out highlights can be prevented in bright subjects such as snow mountains.

The light receiving element may be formed of an organic photoelectric conversion layer. When the organic photoelectric conversion layer s formed of, for example, a material that can be photoelectrically converted in response to green light, an organic material containing a rhodamine-based coloring matter, a merocyanine-based coloring matter, quinacridone, or the like may be given, for example. Alternatively, as the material that forms the organic photoelectric conversion layer, pentacene and a derivative thereof (TIPS-pentacene etc.), naphthacene and a derivative thereof (rubrene and hexapropylnaphthacene), thiophene and a derivative thereof (P3HT etc.), a fullerene and a derivative thereof (PCBM etc.), TCNQ, perylene and a derivative thereof, a porphyrin and a derivative of the porphyrin, acridine and a derivative thereof, coumarin and a derivative thereof, quinacridone and a derivative thereof, a cyanine and a derivative thereof, squarylium and a derivative thereof, an oxazine and a derivative thereof, xanthene triphenylamine and a derivative thereof, benzidine and a derivative thereof, a pyrazoline and a derivative thereof, styrylamine and a derivative thereof, a hydrazone and a derivative thereof, triphenylmethane and a derivative thereof, carbazole and a derivative thereof, a polysilane and a derivative thereof, thiophene and a derivative thereof, a polyamine and a derivative thereof, an oxadiazole and a derivative thereof a triazole and a derivative thereof, a triazine and a derivative thereof, quinoxaline and a derivative thereof, phenanthroline and a derivative thereof, an aluminum quinoline and a derivative thereof, poly(paraphenylene vinylene) and a derivative thereof, polyfluorene and a derivative thereof, polyvinylcarbazole and a derivative thereof, a polythiol and a derivative thereof, polypyrrole and a derivative thereof, and polythiophene and a derivative thereof may be illustrated. Organic materials typified by these may be used singly, or may be used to be mixed or stacked in combination of two or more. In organic materials typified by these, a material having peak sensitivity in the wavelength band of each of red color, green color, and blue color may be selected, and thereby a light receiving element that forms a red imaging element, a green imaging element, or a blue imaging element can be formed.

Alternatively, the light control device (light control element) according to the first aspect to the third aspect of the present disclosure may be used for a display element and a display device. Specifically, the display element is formed of a light emitting element and a light control device disposed on the light incidence side of the light emitting element, and the light control device is formed of the light control device according to the first aspect to the third aspect of the present disclosure. Furthermore, the display device includes display elements arranged in a two-dimensional matrix configuration, the display element is formed of a light emitting element and a light control device disposed on the light incidence side of the light emitting element, and the light control device is finned of the light control device according to the first aspect to the third aspect of the present disclosure. A liquid crystal element and an organic EL element may be given as the light emitting element, and a liquid crystal display device and an organic EL display device may be given as the display device.

The light control device according to the first aspect to the third aspect of the present disclosure may be used for a head-mounted display (HMD). That is, the display is a head-mounted display including (a) an eyeglass-type frame to be mounted on the head of an observer and (b) an image display device attached to the frame, the image display device includes (A) an image formation device and (B) an optical device that the light emitted from the image formation device is incident on, is guided through, and is emitted from, and the light control device according to the first aspect to the third aspect of the present disclosure that adjusts the quantity of external light incident from the outside is disposed in a region of the optical device from which light is emitted.

Additionally, the present technology may also be configured as below.

[A01] <<Light Control Device: First Aspect>>
A light control device including:
a pair of electrodes; and
a light control layer sandwiched by the pair of electrodes,
wherein the light control layer has a stacked structure of a first insulating layer, a first nanocarbon film doped with an impurity of a first conductivity type or not doped with an impurity, a second nanocarbon film doped with an impurity of a second conductivity type different from the first conductivity type or not doped with an impurity, and a second insulating layer.

[A02]
The light control device according to [A01], wherein a voltage is applied to the pair of electrodes to control the amount of charge generated in the first nanocarbon film and/or the second nanocarbon film and thereby a light transmittance in the light control layer is controlled.

[A03]
The light control device according to [A01] or [A02], wherein
N light control layers and (N+1) electrodes are provided,
the N light control layers and the (N+1) electrodes are alternately stacked, and
the electrodes in odd positions are connected to a first interconnection and the electrodes in even positions are connected to a second interconnection.

[A04]
The light control device according to any one of [A01] to [A03], wherein
the first conductivity type is an n-type and the second conductivity type is a p-type, and
a voltage higher than a voltage applied to a second electrode facing the second nanocarbon film via the second insulating layer is applied to a first electrode facing the first nanocarbon film via the first insulating layer.

[A05]
The light control device according to any one of [A10] to [A04], wherein a voltage applied to the pair of electrodes is a pulsed voltage.

[A06]
The light control device according to [A05], wherein a light transmittance in the light control layer is controlled by changing a duty ratio of the pulsed voltage.

[A07]
The light control device according to [A05] or [A06], wherein a value obtained by converting a change in light transmittance of a nanocarbon film of the light control layer to frequency is higher than a frequency of the pulsed voltage.

[A08]
The light control device according to [A07], wherein the frequency of the pulsed voltage is not less than $1 \times 10^2$ Hz and not more than $1 \times 10^5$ Hz.

[A09]
The light control device according to any one of [A01] to [A08], wherein a nanocarbon film is formed of graphene.

[B01] <<Light Control Device: Second Aspect>>
A light control device including:
a pair of electrodes; and
a light control layer sandwiched by the pair of electrodes, wherein
the light control layer has a stacked structure of a first insulating layer, a nanocarbon film doped with an impurity or not doped with an impurity, and a second insulating layer, and
a voltage different from a voltage applied to the pair of electrodes is applied to the nanocarbon film.

[B02]
The light control device according to [B01], wherein
the impurity is of a p-type and
a voltage higher than the voltage applied to the pair of electrodes is applied to the nanocarbon film.

[B03]
The light control device according to [B01], wherein
the impurity is of an n-type and
a voltage lower than the voltage applied to the pair of electrodes is applied to the nanocarbon film.

[B04]
The light control device according to any one of [B01] to [B03], wherein the voltage applied to the nanocarbon film is a pulsed voltage.

The light control device according to [B104], wherein a light transmittance in the light control layer is controlled by changing a duty ratio of the pulsed voltage.

[B06]

The light control device according to [B04] or [B05], wherein a value obtained by converting a change in light transmittance of a nanocarbon film of the light control layer to frequency is higher than a frequency of the pulsed voltage.

[B07]

The light control device according to [B06], wherein the frequency of the pulsed voltage is not less than $1\times10^2$ Hz and not more than $1\times10^5$ Hz.

[B08]

The light control device according to any one of [B01] to [B07], wherein the nanocarbon film is formed of graphene.

[C01] <<Light Control Device: Third Aspect>>

A light control device including:

a pair of electrodes; and a stacked structure body in which M (provided that M ? 2) light control layers sandwiched by the pair of electrodes are stacked, wherein an m-th light control layer (provided that 1 ? m ? (M−1)) has a stacked structure of a first insulating layer, a first nanocarbon film doped with an n-type impurity or not doped with an impurity, a second insulating layer, and a second nanocarbon film doped with a p-type impurity or not doped with an impurity, an M-th light control layer has a stacked structure of the first insulating layer, the first nanocarbon film doped with an n-type impurity or not doped with an impurity, the second insulating layer, the second nanocarbon film doped with a p-type impurity or not doped with an impurity, and a third insulating layer, and a voltage different from a voltage applied to the first nanocarbon film is applied to the second nanocarbon film.

[C02]

The light transmittance control method for a light control device according to [C01], wherein a voltage not more than the voltage applied to the second nanocarbon film and not less than the voltage applied to the first nanocarbon film is applied to the pair of electrodes.

[C03]

The light transmittance control method for a light control device according to [C01] or [C02], wherein the first nanocarbon film is connected to a first interconnection and the second nanocarbon film is connected to a second interconnection.

[C04]

The light control device according to any one of [C01] to [C03], wherein the voltage applied to the second nanocarbon film and the first nanocarbon film is a pulsed voltage.

[C05]

The light control device according to [C04], wherein a light transmittance m the light control layer is controlled by changing a duty ratio of the pulsed voltage.

[C06]

The light control device according to [C04] or [C05], wherein a value obtained by converting a change in light transmittance of a nanocarbon film of the light control layer to frequency is higher than a frequency of the pulsed voltage.

[C07]

The light control device according to [C06], wherein the frequency of the pulsed voltage is not less than $1\times10^2$ Hz and not more than $1\times10^5$ Hz.

[C08]

The light control device according to any one of [C01] to [C07], wherein the nanocarbon film is formed of graphene.

[E01] <<Imaging Element: First Aspect>>

An imaging element including:

a light receiving element; and a light control device disposed on a light incidence side of the light receiving element, wherein the light control device includes a pair of electrodes, and a light control layer sandwiched by the pair of electrodes, and the light control layer has a stacked structure of a first insulating layer, a first nanocarbon film doped with an impurity of a first conductivity type or not doped with an impurity, a second nanocarbon film doped with an impurity of a second conductivity type different from the first conductivity type or not doped with an impurity, and a second insulating layer.

[E02] <<Imaging Element: Second Aspect>>

An imaging element including:

a light receiving element: and a light control device disposed on a light incidence side of the light receiving element, wherein the light control device includes a pair of electrodes, and a light control layer sandwiched by the pair of electrodes, the light control layer has a stacked structure of a first insulating layer, a nanocarbon film doped with an impurity or not doped with an impurity, and a second insulating layer, and a voltage different from a voltage applied to the pair of electrodes is applied to the nanocarbon film.

[E03] <<Imaging Element: Third Aspect>>

An imaging element including:

a light receiving element; and a light control device disposed on a light incidence side of the light receiving element, wherein the light control device includes a pair of electrodes, and a stacked structure body in which M (provided that M ? 2) light control layers sandwiched by the pair of electrodes are stacked, an m-th light control layer (provided that 1 ? m ? (M−1)) has a stacked structure of a first insulating layer, a first nanocarbon film doped with an n-type impurity or not doped with an impurity, a second insulating layer, and a second nanocarbon film doped with a p-type impurity or not doped with an impurity, an M-th light control layer has a stacked structure of the first insulating layer, the first nanocarbon film doped with an n-type impurity or not doped with an impurity, the second insulating layer, the second nanocarbon film doped with a p-type impurity or not doped with an impurity, and a third insulating layer, and a voltage different from a voltage applied to the first nanocarbon film is applied to the second nanocarbon film.

[F01] <<Imaging Device: First Aspect>>

An imaging device including imaging elements arranged in a two-dimensional matrix configuration, wherein at least part of the imaging elements arranged in a two-dimensional matrix configuration include a light receiving element and a light control device disposed on a light incidence side of the light receiving element, the light control device includes a pair of electrodes, and a light control layer sandwiched by the pair of electrodes, and the light control layer has a stacked structure of a first insulating layer, a first nanocarbon film doped with an impurity of a first conductivity type or not doped with an impurity, a second nanocarbon film doped with an impurity of a second conductivity type different from the first conductivity type or not doped with an impurity, and a second insulating layer.

[F02] <<Imaging Device: Second Aspect>>

An imaging device including imaging elements arranged in a two-dimensional matrix configuration, wherein at least part of the imaging elements arranged in a two-dimensional matrix configuration include a light receiving element and a light control device disposed on a light incidence side of the light receiving element, the light control device includes a pair of electrodes, and a light control layer sandwiched by the pair of electrodes, the light control layer has a stacked structure of a first insulating layer, a nanocarbon film doped with an impurity or not doped with an impurity, and a second insulating layer, and a voltage different from a voltage applied to the pair of electrodes is applied to the nanocarbon film.

[F03] <<Imaging Device: Third Aspect>>

An imaging device including imaging elements arranged in a two-dimensional matrix configuration, wherein at least part of the imaging elements arranged in a two-dimensional matrix configuration include a light receiving element and a light control device disposed on a light incidence side of the light receiving element, the light control device includes a pair of electrodes, and a stacked structure body in which M (provided that M ?2) light control layers sandwiched by the pair of electrodes are stacked, an m-th light control layer (provided that 1 ? m ? (M−1)) has a stacked structure of a first insulating layer, a first nanocarbon film doped with an n-type impurity or not doped with an impurity, a second insulating layer, and a second nanocarbon film doped with a p-type impurity or not doped with an impurity, an M-th light control layer has a stacked structure of the first insulating layer, the first nanocarbon film doped with an n-type impurity or not doped with an impurity, the second insulating layer, the second nanocarbon film doped with a p-type impurity or not doped with an impurity, and a third insulating layer, and a voltage different from a voltage applied to the first nanocarbon film is applied to the second nanocarbon film.

[F04]

The imaging device according to any one of [F01] to [F03], wherein the pair of electrodes are shared between imaging elements including the light control device.

[F05]

The imaging device according to any one of [F01] to [F03], wherein the pair of electrodes shared between imaging elements including the light control device are provided to be also shared with an imaging element not including the light control device.

[G01] <<Light Transmittance Control Method for Light Control Device: First Aspect>>

A light transmittance control method for a light control device, the light control device (light control element) including a pair of electrodes, and a light control layer sandwiched by the pair of electrodes, wherein the light control layer has a stacked structure of a first insulating layer, a first nanocarbon film doped with an impurity of a first conductivity type or not doped with an impurity, a second nanocarbon film doped with an impurity of a second conductivity type different from the first conductivity type or not doped with an impurity, and a second insulating layer, and light of a wavelength not less than a wavelength $\lambda 0$ is allowed to pass at a higher light transmittance than light of a wavelength less than the wavelength $\lambda 0$ by applying a prescribed voltage V0 between the pair of electrodes.

the light transmittance control method including controlling an effective light transmittance of the light control layer for light of a wavelength not less than the wavelength $\lambda 0$ by changing a duty ratio of the pulsed prescribed voltage V0.

[H01] <<Light Transmittance Control Method for Light Control Device: Second Aspect>>

A light transmittance control method for a light control device, the light control device (light control element) including a pair of electrodes, and a light control layer sandwiched by the pair of electrodes, wherein the light control layer has a stacked structure of a first insulating layer, a nanocarbon film doped with an impurity or not doped with an impurity, and a second insulating layer, and light of a wavelength not less than a wavelength $\lambda 0$ is allowed to pass at a higher light transmittance than light of a wavelength less than the wavelength $\lambda 0$ by applying a prescribed voltage V0 different from a voltage applied to the pair of electrodes to the nanocarbon film, the light transmittance control method including controlling an effective light transmittance of the light control layer for light of a wavelength not less than the wavelength $\lambda 0$ by changing a duty ratio of the pulsed prescribed voltage V0.

[H02]

The light transmittance control method for a light control device according to [H01], wherein the impurity is of a p-type and a voltage higher than the voltage applied to the pair of electrodes is applied to the nanocarbon film.

[H03]

The light transmittance control method for a light control device according to [H01], wherein the impurity is of an n-type and a voltage lower than the voltage applied to the pair of electrodes is applied to the nanocarbon film.

[J01] <<Light Transmittance Control Method for Light Control Device: Third Aspect>>

A light transmittance control method for a light control device, the light control device (light control element) including a pair of electrodes, and a stacked structure body in which M (provided that M ? 2) light control layers sandwiched by the pair of electrodes are stacked, wherein an m-th light control layer (provided that 1 ? m ? (M~1)) has a stacked structure of a first insulating layer, a first nanocarbon film doped with an n-type impurity or not doped with an impurity, a second insulating layer, and a second nanocarbon film doped with a p-type impurity or not doped with an impurity, an M-th light control layer has a stacked structure of the first insulating layer, the first nanocarbon film doped with an n-type impurity or not doped with an impurity, the second insulating layer, the second nanocarbon film doped with a p-type impurity or not doped with an impurity, and a third insulating layer, and light of a wavelength not less than a wavelength λ0 is allowed to pass at a higher light transmittance than light of a wavelength less than the wavelength λ0 by applying a prescribed voltage V0 (provided that a voltage applied to the second nanocarbon film is different from a voltage applied to the first nanocarbon film) between the second nanocarbon film and the first nanocarbon film, the light transmittance control method including controlling an effective light transmittance of the light control layer for light of a wavelength not less than the wavelength λ0 by changing a duty ratio of the pulsed prescribed voltage V0.

[J02]

The light transmittance control method for a light control device according to [J01], wherein a voltage not more than the voltage applied to the second nanocarbon film and not less than the voltage applied to the first nanocarbon film is applied to the pair of electrodes.

[J03]

The light transmittance control method for a light control device according to [J01] or [J02], wherein the first nanocarbon film is connected to a first interconnection and the second nanocarbon film is connected to a second interconnection.

[K01]

The light transmittance control method for a light control device according to any one of [G01] to [J03], wherein a value obtained by converting a change in light transmittance of a nanocarbon film of the light control layer to frequency is higher than a frequency of the pulsed voltage.

[K02]

The light transmittance control method for a light control device according to [K01], wherein the frequency of the pulsed voltage is not less than $1 \times 10^2$ Hz and not more than $1 \times 10^5$ Hz.

[K03]

The light transmittance control method for a light control device according to any one of [G01] to [K02], wherein the nanocarbon film is formed of graphene.

REFERENCE SIGNS LIST $10_1$, $10_2$, $510_1$, $510_2$, 610 light control device
11, 12, 512, 513, 612, 613 electrode
13, 513, 613 light control layer
613' stacked structure body of light control layers
14, 514, 614 first insulating layer
15, 615 first nanocarbon film
16, 616 second nanocarbon film
515, 516 nanocarbon film
17, 517, 617 second insulating layer
617' third insulating layer
18, 618 first interconnection
19, 619 second interconnection
$20_1$, $20_2$ imaging element
21 light control device
22 silicon semiconductor substrate
23 interlayer insulating film
24 protective film
25 color filter layer (or planarization film)
26 condensing lens (on-chip lens)
27 light receiving element (photosensor, photodiode, photoelectric conversion element)
28 interlayer insulating layer
29 protective film
$R_1$, $R_0$, $G_1$, $G_0$, $B_1$, $B_0$ imaging element

The invention claimed is:

1. A light control device, comprising:
a first electrode;
a second electrode; and
a light control layer between the first electrode and the second electrode,
wherein the light control layer has a stacked structure that includes:
a first insulating layer in contact with the first electrode,
a first nanocarbon film that is one of doped with an impurity of a first conductivity type, or undoped,
a second nanocarbon film that is one of doped with an impurity of a second conductivity type, or undoped, wherein the second nanocarbon film is in contact with the first nanocarbon film, and
a second insulating layer in contact with the second electrode.

2. The light control device according to claim 1, wherein the light control device is configured to:
control an amount of charge generated in at least one of the first nanocarbon film or the second nanocarbon film, wherein the amount of charge generated is controlled based on an application of a voltage to the first electrode and the second electrode; and
control a light transmittance in the light control layer based on the amount of charge.

3. The light control device according to claim 1, further comprising:
N light control layers; and
(N+1) electrodes, wherein
the N light control layers and the (N+1) electrodes are alternately stacked,
a first set of electrodes, of the (N+1) electrodes, in odd positions are connected to a first interconnection, and
a second set of electrodes, of the (N+1) electrodes, in even positions are connected to a second interconnection.

4. The light control device according to claim 1, wherein
the first conductivity type is an n-type,
the second conductivity type is a p-type,
a first voltage applied to the first electrode is higher than a second voltage applied to the second electrode,
the second electrode faces the second nanocarbon film through the second insulating layer, and
the first electrode faces the first nanocarbon film through the first insulating layer.

5. The light control device according to claim 1, wherein a voltage applied to each of the first electrode and the second electrode is a pulsed voltage.

6. The light control device according to claim 5, wherein the light control device is configured to control a light transmittance in the light control layer based on a change in a duty ratio of the pulsed voltage.

7. The light control device according to claim 1, wherein at least one of the first nanocarbon film or the second nanocarbon film includes graphene.

8. An imaging element, comprising:
a light receiving element; and
a light control device on a light incidence side of the light receiving element, wherein the light control device includes:
a first electrode;
a second electrode; and
a light control layer between the first electrode and the second electrode,
wherein the light control layer has a stacked structure that includes:
a first insulating layer in contact with the first electrode, a first nanocarbon film that is one of doped with an impurity of a first conductivity type, or undoped, a second nanocarbon film that is one of doped with an impurity of a second conductivity type, or undoped, wherein the second nanocarbon film is in contact with the first nanocarbon film, and a second insulating layer in contact with the second electrode.

9. An imaging device, comprising:

a plurality of imaging elements in a two-dimensional matrix configuration, wherein at least a part of the plurality of imaging elements includes:

a light receiving element; and a light control device on a light incidence side of the light receiving element, wherein the light control device includes:

a first electrode;

a second electrode; and a light control layer between the first electrode and the second electrode, wherein the light control layer has a stacked structure that includes:

a first insulating layer in contact with the first electrode, a first nanocarbon film that is one of doped with an impurity of a first conductivity type, or undoped, a second nanocarbon film that is one of doped with an impurity of a second conductivity type, or undoped, wherein the second nanocarbon film is in contact with the first nanocarbon film, and a second insulating layer in contact with the second electrode.

10. The imaging device according to claim 9, wherein the first electrode and the second electrode are shared between the part of the plurality of imaging elements including the light control device.

11. The imaging device according to claim 9, wherein the first electrode and the second electrode are shared between the plurality of imaging elements.

* * * * *